(12) United States Patent
Oshima et al.

(10) Patent No.: US 11,415,666 B2
(45) Date of Patent: Aug. 16, 2022

(54) AD CONVERTER DEVICE AND MILLIMETER WAVE RADAR SYSTEM

(71) Applicant: RENESAS ELECTRONICS CORPORATION, Tokyo (JP)

(72) Inventors: Takashi Oshima, Tokyo (JP); Tetsuo Matsui, Tokyo (JP); Mitsuya Fukazawa, Tokyo (JP); Katsuki Tateyama, Tokyo (JP); Masaki Fujiwara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 492 days.

(21) Appl. No.: 16/585,924

(22) Filed: Sep. 27, 2019

(65) Prior Publication Data

US 2020/0166606 A1    May 28, 2020

(30) Foreign Application Priority Data

Nov. 22, 2018 (JP) ............................. JP2018-219382

(51) Int. Cl.
  *G01S 7/35* (2006.01)
  *H03M 3/00* (2006.01)
  *G01S 13/34* (2006.01)

(52) U.S. Cl.
  CPC .............. *G01S 7/354* (2013.01); *G01S 13/34* (2013.01); *H03M 3/38* (2013.01); *H03M 3/414* (2013.01); *H03M 3/464* (2013.01); *H03M 3/496* (2013.01)

(58) Field of Classification Search
  CPC ........ G01S 7/354; G01S 13/34; G01S 7/4021; G01S 13/931; H03M 3/38; H03M 3/414;
  (Continued)

(56) References Cited

U.S. PATENT DOCUMENTS 6,970,120 B1    11/2005  Bjornsen
9,178,529 B2 *  11/2015  Dong ................... H03M 3/344
(Continued)

FOREIGN PATENT DOCUMENTS

JP    2005-217514 A    8/2005
JP    2014-090308 A    5/2014
JP    2018-182610 A    11/2018

OTHER PUBLICATIONS

Yun-Shiang Shu et al., "LMS-Based Noise Leakage Calibration of Cascaded Continuous-Time ΔΣ Modulators", IEEE JSSC, 2010, vol. 45, p. 368-379.

(Continued)

*Primary Examiner* — Khai M Nguyen
(74) *Attorney, Agent, or Firm* — McDermott Will & Emery LLP

(57) ABSTRACT

A MASH type sigma delta AD converter includes a modulator, an analog filter filtering an extraction signal obtained by extracting a probe signal and an quantization error generated in a quantizer within a sigma delta modulator, a low speed AD converter performing an AD conversion of an output signal of the analog filter, a first adaptive filter searching for a transfer function of the sigma delta modulator, a second adaptive filter searching for a transfer function from an output of the modulator to the low speed AD converter via the analog filter, and a noise cancellation circuit cancelling the probe signal and the quantization error included in an output signal of the quantizer using the search results by the first and second adaptive filters.

20 Claims, 29 Drawing Sheets

(58) Field of Classification Search
CPC ...... H03M 3/464; H03M 3/496; H03M 1/468; H03M 3/386; H03M 3/46; H03M 3/416
USPC .......................................... 341/77, 143, 155
See application file for complete search history.

(56) References Cited

U.S. PATENT DOCUMENTS

| | | | |
|---|---|---|---|
| 9,231,614 B2* | 1/2016 | Silva | H03M 3/464 |
| 10,707,894 B2* | 7/2020 | Oshima | G01S 7/354 |
| 2005/0162219 A1 | 7/2005 | Adan | |
| 2010/0079324 A1 | 4/2010 | Lakdawala et al. | |
| 2018/0302102 A1 | 10/2018 | Oshima et al. | |

OTHER PUBLICATIONS

Japanese Notice of Reasons for Refusal issued in corresponding Japanese Patent Application No. 2018-219382, dated Jan. 25, 2022, with English translation.

* cited by examiner

AD CONVERTER DEVICE AND MILLIMETER WAVE RADAR SYSTEM

CROSS-REFERENCE TO RELATED APPLICATIONS

The disclosure of Japanese Patent Application No. 2018-219382 filed on Nov. 22, 2018 including the specification, drawings and abstract is incorporated herein by reference in its entirety.

BACKGROUND

The present application relates to an AD (analog-to-digital) converter device and a millimeter wave radar system with it, for example an AD converter device and a millimeter wave radar system with it suitable for carrying out a highly accurate AD conversion.

U.S. Pat. No. 6,970,120 (Patent Document 1) discloses an AD conversion circuit including a calibration circuit which searches for a filtering coefficient of a calibration filter. The calibration circuit searches for the filtering coefficient by observing a final output of the AD converter while supplying a pseudo random signal to the AD conversion circuit, in a start-up time of the AD conversion circuit.

Non-Patent Literature 1 (Yun-Shiang Shu and four others, "LMS-Based Noise Leakage Calibration of Cascaded Continuous-Time $\Delta\Sigma$ Modulators", IEEE JSSC, Vol. 45, February 2010, p. 368-379) discloses a $\Delta\Sigma$ modulator including a calibration circuit for performing calibration so that a time constant of an analog loop filter matches a time constant of a digital noise cancellation filter. In particular, the calibration circuit searches for the time constant of the analog loop filter using an LMS (Least Mean Square) algorithm, while injecting binary pulses into a quantizer. This analog loop filter is to zeroize residual power in a final output of the $\Delta\Sigma$ modulator.

SUMMARY

For example, millimeter wave radar systems for on-vehicle use need a robust AD converter having a high resolution and a wide signal band. As an AD converter this need, a known one is a MASH (Multi stAge Noise SHaping) type sigma delta ($\Sigma\Delta$) AD converter device (also called a delta sigma ($\Delta\Sigma$) AD converter). Note, however, that in the MASH type $\Sigma\Delta$ AD converter device, it is not possible to enhance the resolution, if a characteristic variation occurs in an analog circuit. It is thought to perform calibration using the methods of the Patent Document 1 and the Non-Patent Literature 1. However, the methods of the Patent Document 1 and the Non-Patent Literature 1 cannot execute highly accurate AD conversion because of inadequate calibration.

According to one embodiment, there is provided a MASH type sigma delta AD converter device comprising a probe signal generation circuit, a first modulator, an analog filter, a first AD converter, a first adaptive filter, a second adaptive filter and a noise cancellation circuit. The probe signal generation circuit generates a probe signal. The first modulator includes a first analog integrator configured with an analog circuit and a first quantizer for quantizing an addition signal obtained by adding the probe signal and an output signal of the first analog integrator. The analog filter filters an extraction signal obtained by extracting the probe signal and a quantization error generated in the first quantizer. The first AD converter converts an output signal of the analog filter from an analog signal to a digital signal, the first AD converter operating at an operation frequency lower than an operation frequency of the first modulator. The first adaptive filter searches for a first transfer function which is a transfer function of the first modulator by observing an output signal of the first quantizer in accordance with the probe signal. The second adaptive filter searches for a second transfer function which is a transfer function from an output of the first modulator to the first AD converter via the analog filter by observing an output signal of the first AD converter in accordance with the probe signal. The noise cancellation circuit cancels the quantization error and the probe signal included in the output signal of the first quantizer using the search result of the first adaptive filter and the search result of the second adaptive filter.

According to one embodiment, there is provided a millimeter wave radar system comprising a transmission antenna, a plurality of reception antennas, a high frequency unit, a low pass filter and a baseband unit. The transmission antenna radiates a transmission wave into the air. The plurality of reception antennas receive a reflected wave from an object for the transmission wave. The high frequency unit generates a plurality of beat signal by down-converting the reflected wave received by the plurality of reception antennas using the transmission wave. The low pass filter filters the plurality of beat signals. The baseband unit processes the plurality of beat signals filtered by the low pass filter. The baseband unit includes a plurality of MASH type sigma delta AD converters for converting the plurality of beat signals filtered by the low pass filter from analog signals to digital signals respectively. Each of the MASH type sigma delta AD converters comprises a probe signal generation circuit, a first modulator, an analog filter, a first AD converter, a first adaptive filter, a second adaptive filter and a noise cancellation circuit. The probe signal generation circuit generates a probe signal. The first modulator includes a first analog integrator configured with an analog circuit and a first quantizer for quantizing an addition signal obtained by adding the probe signal and an output signal of the first analog integrator. The analog filter filters an extraction signal obtained by extracting the probe signal and a quantization error generated in the first quantizer. The first AD converter converts an output signal of the analog filter from an analog signal to a digital signal, the first AD converter operating at an operation frequency lower than an operation frequency of the first modulator. The first adaptive filter searches for a first transfer function which is a transfer function of the first modulator by observing an output signal of the first quantizer in accordance with the probe signal. The second adaptive filter searches for a second transfer function which is a transfer function from an output of the first modulator to the first AD converter via the analog filter by observing an output signal of the first AD converter in accordance with the probe signal. The noise cancellation circuit cancels the quantization error and the probe signal included in the output signal of the first quantizer using the search result of the first adaptive filter and the search result of the second adaptive filter.

According to the above-mentioned embodiments, it is possible to provide the AD converter device and the millimeter wave radar system capable of executing a highly accurate AD conversion.

DETAILED DESCRIPTION

Figure 1:
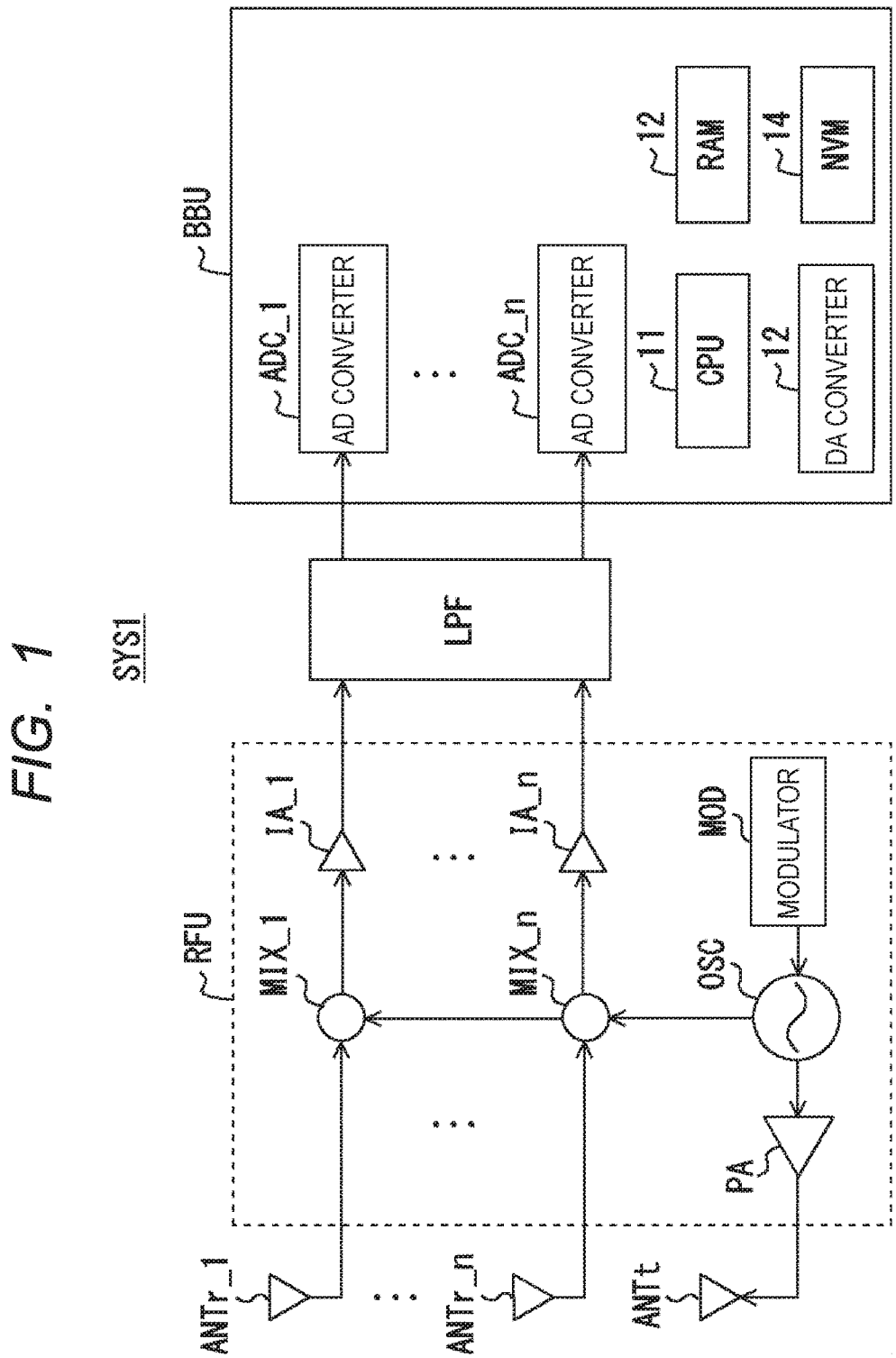
FIG. 1 is a schematic diagram illustrating a configuration example of a main part of a millimeter wave radar system according to a first embodiment.

For the clarification of the description, the following description and the drawings may be omitted or simplified as appropriate. Further, each element shown in the drawings as functional blocks that perform various processing can be formed of a CPU (Central Processing Unit), a memory, and other circuits in hardware and may be implemented by programs loaded into the memory in software. Those skilled in the art will therefore understand that these functional blocks may be implemented in various ways by only hardware, only software, or the combination thereof without any limitation. Throughout the drawings, the same components are denoted by the same reference signs and overlapping descriptions will be omitted as appropriate.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

First Embodiment

Schematic of Millimeter Wave Radar System

FIG. 1 is a schematic diagram illustrating a configuration example of a main part of a millimeter wave radar system SYS1 according to a first embodiment. As shown in FIG. 1, the millimeter wave radar system SYS 1 includes a baseband unit BBU, a high frequency unit RFU, a low pass filter LPF, a transmission antenna ANTt, and the "n" number (n is an integer equal to or greater than 1) of reception antennas ANTr_1 to ANTr_n.

The high frequency unit RFU is a unit that process various signals in a high-frequency band. The high frequency unit RFU includes a modulator MOD, an oscillator OSC and a power amplifier PA as transmitting circuit. The high frequency unit RFU includes the "n" number of mixers MIX_1 to MIX_n and the "n" number of amplifiers IA_1 to IA_n as receiving circuit.

The baseband unit BBU is comprised with one semiconductor chip, for example, a micro controller, and performs various signal processes in a baseband. The baseband unit BBU includes the "n" number of AD converters ADC_1 to ADC_n, a CPU 11, a RAM 12, a DA converter 13, and a NVM (Non Volatile memory) 14 such as a flash memory.

The modulator MOD and the oscillator OSC generate a frequency-modulated transmission wave (a transmission wave with an FM-CW method) or two transmission waves (transmission waves with a two-frequency CW method) with different frequencies from a baseband signal output from the baseband unit BBU. The transmission wave includes frequencies of 60 GHz band or 76 GHz band, and is radiated into the air from the transmission antenna ANTt via the power amplifier PA.

The transmission wave radiated into the air from the transmission antenna ANTt is reflected by an object and then received by the "n" number of reception antennas ANTr_1 to ANTr_n. The "n" number of mixers MIX_1 to MIX_n down-convert respectively the received waves (reflected waves) received by the reception antennas ANTr_1 to ANTr_n using the transmission wave from the oscillator OSC, thereby outputting the "n" number of beat signals. The "n" number of beat signals are input to the "n" number of AD converters ADC_1 to ADC_n of the baseband unit BBU via the low pass filter (an anti-aliasing filter) LPF, respectively.

In the baseband unit BBU, the "n" number of AD converters ADC_1 to ADC_n each includes the MASH type and sigma delta($\Sigma\Delta$) type configuration, and convert the "n" number of beat signals from the low pass filter LPF into digital signals, respectively. The baseband unit BBU processes the digital signals output from the AD converters ADC_1 to ADC_n using a CPU 11 or the like, thereby detecting the distance or the relative speed to the object.

The above-mentioned millimeter wave radar system SYS1 is used not only in fields such as automation and healthcare device, but also in various other fields. Here, the "n" number of AD converters ADC_1 to ADC_n are required to have a high resolution (that is, a wide dynamic range) and a wide signal band in order to improve the radar performance of the millimeter wave radar system SYS1. A sigma delta AD converter (a sigma delta AD converter device) is known as an AD converter satisfying this requirement.

The sigma-delta ADC has a high sampling rate (sampling frequency), in operation principle for performing the over sampling. Therefore, when the sigma delta AD converter is adopted for the AD converters ADC_1 to ADC_n provided in the millimeter wave radar system SYS1, it is possible to relax the specification of the low-pass filter (an anti-aliasing filter) LPF and it is more effective than the case in which a nyquist AD converter (for example, a pipeline type, a successive comparison type, or a flash type). The sigma delta AD converter is comprised with a discrete time type (example, a switched capacitor type) integrator or a continuous time type (for example, an RC type) integrator. For example, when the sigma delta AD converter comprised with the continuous time type integrator, the specification of the low-pass filter LPF can further be relaxed. This may facilitate widening of the signal band of the sigma delta AD converter.

Schematic and Issue of MASH Type Sigma Delta AD Converter Device

Figure 27:
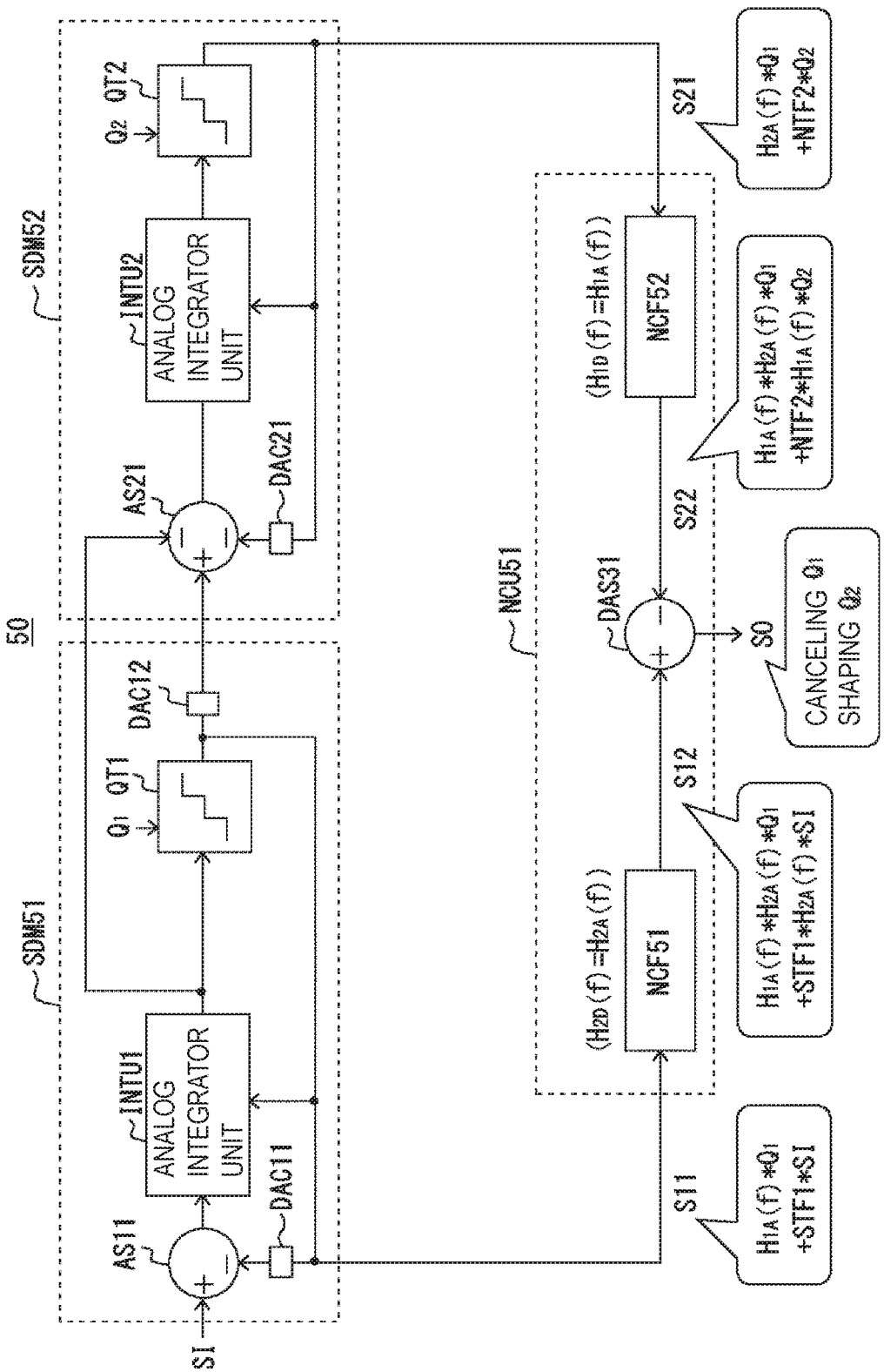
FIG. 27 is a block diagram illustrating a basic configuration example of a MASH type sigma delta AD converter device.

First, a basic configuration of the MASH type sigma delta AD converter device will be described. FIG. 27 is a block diagram illustrating a basic configuration example of a MASH type sigma delta AD converter device 50. As shown in FIG. 27, the MASH type sigma delta AD converter 50 converts an external input signal SI, which is an analog signal input from the outside, into a digital signal, and outputs the digital signal as an external output signal SO.

The MASH type sigma delta AD converter 50 includes modulators (sigma delta modulators) SDM51 and SDM52 in plural stages (in this case, two stages) and a noise cancellation circuit NCU51.

The modulator SDM51 in a first-stage includes an analog adder-subtractor AS11, an analog integrator unit INTU1, a quantizer QT1, and DA converter circuits DAC11 and DAC12.

The quantizer QT1 quantizes an output signal of the analog integrator unit INTU1 configured with an analog circuit. The DA converter circuits DAC11 and DAC12 both convert an output signal of the quantizer QT1 into an analog signal. The analog adder-subtractor AS11 outputs a differential signal between the external input signal SI and an output signal of the DA converter circuit DAC11 to the analog integrator unit INTU1. Here, in the quantizer QT1, a quantization error Q1 is generated in a form of being added by the quantizer QT1. The quantization error Q1 can be extracted from a differential signal between an output signal of the DA converter circuit DAC12 and the output signal of the analog integrator unit INTU1.

The modulator SDM52 in a second-stage includes an analog adder-subtractor AS21, an analog integrator unit INTU2, a quantizer QT2, and a DA converter circuit DAC21. The quantizer QT2 quantizes an output signal of the analog integrator unit INTU2 configured with an analog circuit. In the quantizer QT2 also, like the case of the quantizer QT1, a quantization error Q2 is generated. The DA converter circuit DAC21 converts an output signal of the quantizer QT2 into an analog signal. The analog adder-subtractor AS21 outputs a differential signal between the extraction signal of the quantization error Q1 generated in the above-described modulator SDM51 and an output signal of the DA converter circuit DAC21 to the analog integrator unit INTU2.

The noise cancellation circuit NCU 51 includes noise cancellation filters NCF51 and NCF52, and the digital adder-subtractor DAS31. The noise cancellation filter NCF51 is a digital filter to which an output signal S11 of the quantizer QT1 is input. The noise cancellation filter NCF52 is a digital filter to which an output signal S21 of the quantizer QT2 is input. The digital filters may, for example, be a FIR (Finite Impulse Response) filter for realizing a desired filter characteristic using a plurality of tap coefficients or an IIR (Infinite Impulse Response) filter. The digital adder-subtractor DAS31 calculates a difference (in this case "S12-S22") between an output signal S12 of the noise cancellation filter NCF51 and an output signal S22 of the noise cancellation filter NCF52, and outputs the external output signal SO.

Hereinafter, the transfer function $H_{1A}(f)$ is defined as "a transfer function from an application point of the quantization error Q1 to the output signal S11 of the modulator SDM51 (the quantizer QT1)". In the case of FIG. 27, the transfer function $H_{1A}(f)$ coincides with a noise transfer function (NTF) of the modulator SDM51. The transfer function $H_{2A}(f)$ is defined as "a transfer function from an application point of the quantization error Q1 to the output signal S21 of the modulator SDM52 (the quantizer QT2)". In the case of FIG. 27, the transfer function $H_{2A}(f)$ coincides with a signal transfer function (STF) of the modulator SDM52.

The output signal S11 of the modulator SDM51 is represented as "$H_{2A}(f) \cdot Q1 + STF1 \cdot SI$". Here, "STF1" is the signal transfer function of the modulator SDM51. The output signal S21 of the modulator SDM52 is represented as "$H_{2A}(f) \cdot Q1 + NTF2 \cdot Q2$". Here, "NTF2" is the noise transfer function of the modulator SDM52.

Here, the transfer function $H_{2D}(f)$ of the noise cancellation filter NCF51 is set as the transfer function $H_{2A}(f)$ in advance. The transfer function $H_{1D}(f)$ of the noise cancellation filter NCF52 is set as the transfer function $H_{1A}(f)$ in advance. As a result, the output signal S12 of the noise cancellation filter NCF51 can be represented as "$H_{1A}(f) \cdot H_{2A}(f) \cdot Q1 + STF1 \cdot H_{2A}(f) \cdot SI$". The output signal S22 of the noise cancellation filter NCF52 can be represented as "$H_{2A}(f) \cdot H_{1A}(f) \cdot Q1 + NTF2 \cdot H_{1A}(f) \cdot Q2$".

As a result, a signal component of the external input signal SI is delayed by a degree (that is, by a degree of total integration of the analog integrator units INTU1 and INTU2) of "$STF1 \cdot H_{2A}(f)$", and then output as the external output signal SO.

The quantization error Q1 is canceled. In addition, the quantization error Q2 is reduced with noise shaping by a degree (by a degree of total integration) of "$NTF2 \cdot H_{1A}(f)$".

For example, in the millimeter wave radar system SYS1 shown in FIG. 1, an input noise with a high frequency component may be generated. However, when the MASH type sigma delta AD converter 50 is adopted for the AD converters ADC_1 to ADC_n provided in the millimeter wave radar system SYS1, the MASH type sigma delta AD converter 50 can stably operate even if the external input signal SI includes a high frequency component, as compared with the non-MASH type (a single loop type) sigma delta AD converter.

That is, generally, it is necessary to increase the degree of the integrator, to realize a high resolution of the sigma delta AD converter. Here, when to realize the fourth degree in the MASH type sigma delta AD converter 50, the analog integrator units INTU1 and INTU2 may be comprised respectively with secondary integrators. In the non-MASH type AD converter, quarternary integrators are necessary in a single loop. As a result, a loop operation may easily be unstably processed, if the external input signal SI includes a high frequency component.

For example, when the quarternary MASH type sigma delta AD converter is used, the quantization error Q2 is sufficiently reduced to an ignorable level, by noise shaping corresponding to the fourth degree. Thus, in the MASH type sigma delta AD converter 50, it is possible to attain a high resolution thereof as long as the quantization error Q1 can be canceled. However, when the quantization error Q1 is not sufficiently canceled, the resolution is lowered due to the residual quantization error Q1.

Figure 28:
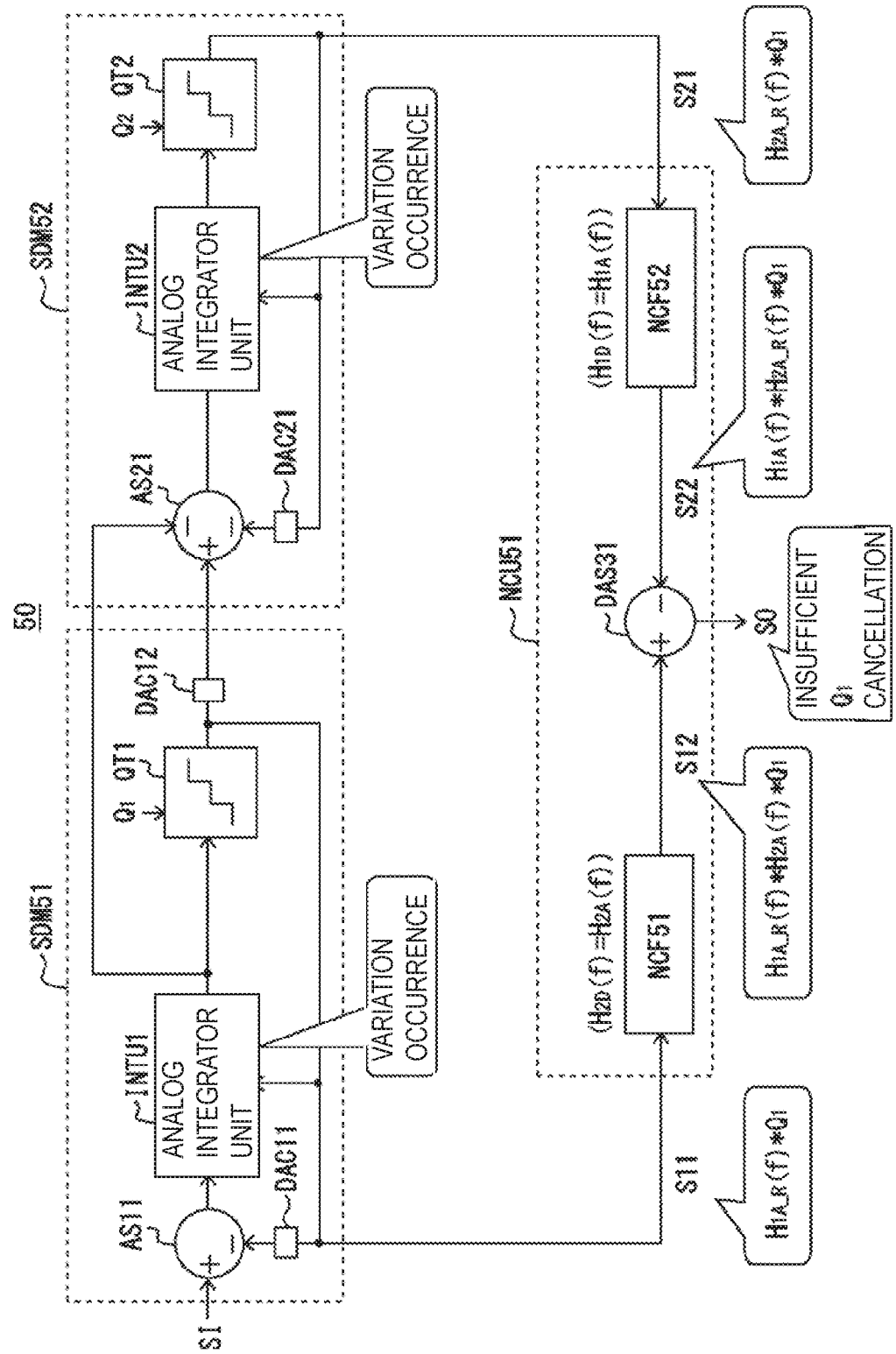
FIG. 28 is a diagram illustrating an example of a problem in the MASH type sigma delta AD converter device shown in FIG. 27.

FIG. 28 is a diagram illustrating an example of a problem in the MASH type sigma delta AD converter device shown in FIG. 27. As shown in FIG. 28, in the actual analog integrator units INTU1 and INTU2, various characteristic variations may be generated with reference to a certain ideal state. Some factors of the characteristic variation include a manufacturing variation of RC (resistor, capacitor) elements, the gain insufficiency of the operational amplifier, and the band insufficiency, in the case of a continuous time type integrator.

As a result, "$H_{1A}(f) \cdot Q1$" in the output signal S11 of the modulator SDM51 is actually "$H_{1A\_R}(f) \cdot Q1$", as shown in FIG. 28. A transfer function $H_{1A\_R}(f)$ is an actual transfer function for an ideal transfer function $H_{1A}(f)$. Similarly, "$H_{2A}(f) \cdot Q1$" in the output signal S21 of the modulator SDM52 is actually "$H_{2A\_R}(f) \cdot Q1$", as shown in FIG. 28. A transfer function $H_{2A\_R}(f)$ is an actual transfer function for an ideal transfer function $H_{2A}(f)$. On the other hand, transfer function $H_{2D}(f)$ and $H_{1D}(f)$ of the noise cancellation filters NCF51 and NCF52 are ideal transfer functions $H_{2A}(f)$ and $H_{1A}(f)$ which are set in advance, respectively. As a result, the quantization error Q1 is insufficiently cancelled. Therefore, the quantization error Q1 is residual in the external output signal SO.

Figure 29:
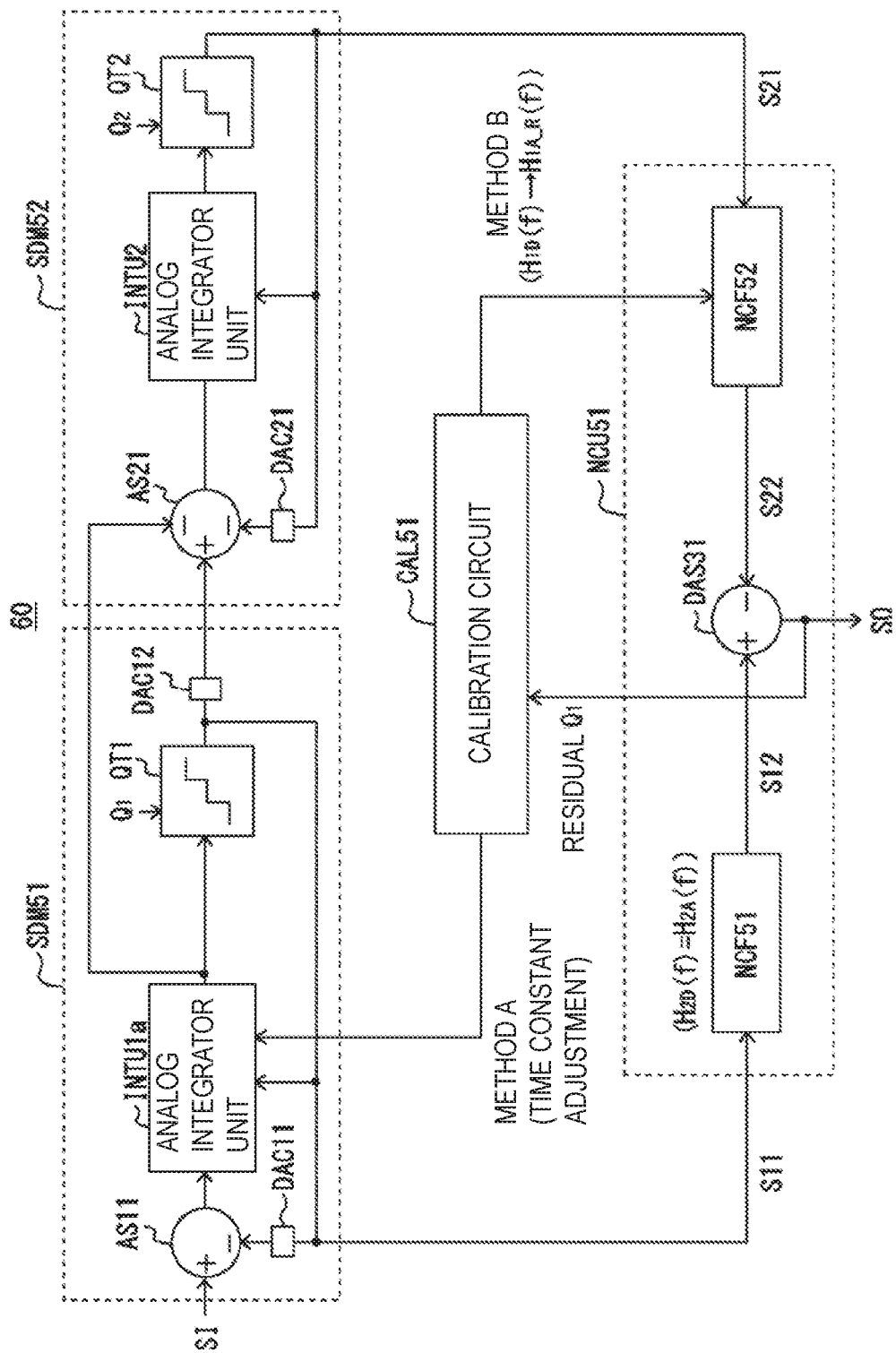
FIG. 29 is a block diagram illustrating a configuration example of a main part of a MASH type sigma delta AD converter device according to a comparative example.

As a solution to the problem, the inventors first examined the MASH type sigma delta AD converter 60 shown in FIG. 29.

Schematic and Issue of MASH Type Sigma Delta AD Converter Device (Comparative Example)

FIG. 29 is a block diagram illustrating a configuration example of a main part of a MASH type sigma delta AD converter device 60 according to a comparative example.

The MASH type sigma delta AD converter 60 shown in FIG. 29 includes an analog integrator unit INTU1a including a variable circuit parameter instead of the analog integrator unit INTU1 provided in the sigma delta modulator SDM51, and further includes a calibration circuit CAL51, as compared with the MASH type sigma delta AD converter 50 shown in FIG. 27. Since the rest of the configuration of the MASH type sigma delta AD converter 60 is the same as that of the MASH type sigma delta AD converter 50, its explanation is omitted.

First, as a first solution, the actual transfer functions $H_{1A\_R}(f)$ and $H_{2A\_R}(f)$ are adjusted and made approximate to the transfer functions $H_{1A}(f)$ and $H_{2A}(f)$ in the ideal state (a method A shown in FIG. 29). Specifically, while the calibration circuit CAL51 observes the residual quantization error Q1 residual to an external output signal SO in a predetermined calibration period, the calibration circuit CAL51 adjusts and minimizes a circuit parameter (specifically, a time constant of the RC) in the analog integrator unit INTU1a. Therefore, the actual transfer function $H_{1A\_R}(f)$ is made approximate to the transfer function $H_{1A}(f)$ in the ideal state.

However, in the first solution (the method A), because a characteristic variation of the operational amplifier in the analog integrator unit INTU1a is not adjusted, the residual quantization error Q1 in the external output signal SO is still insufficiently canceled. It is also conceivable to adjust a circuit parameter of the analog integrator unit INTU2 as well as a circuit parameter of the analog integrator unit INTU1. However, in this manner, when the plurality of analog integrator units INTU1 and INTU2 are adjusted based on one observation result (the residual quantization error Q1 in the external output signal SO), an adjustment process may undesirably be complicated, and adjustment accuracy may undesirably be lowered. In some case, it may be difficult to obtain the solution.

Next, as a second solution, one of the noise cancellation filters NCF51 and NCF52 (in this case, NCF51) is fixed and the other one thereof (NCF52) is adjusted (a method B shown in FIG. 29). Specifically, while the calibration circuit CAL51 observes the residual quantization error Q1 in the external output signal SO in, for example, a predetermined calibration period, it adjusts and minimizes a tap coefficient of the noise cancellation filter NCF52.

However, in the second solution (the method B), because only one of the noise cancellation filters NCF51 and NCF52 is adjusted, the residual quantization error Q1 residual in the external output signal SO cannot be sufficiently suppressed. It is also conceivable to adjust the tap coefficients of both the noise cancellation filters NCF51 and NCF52. However, when the noise cancellation filters NCF51 and NCF52 are adjusted based on one observation result (the residual quantization error Q1 in the external output signal SO), an adjustment process may undesirably be complicated, and adjustment accuracy may undesirably be lowered. In some case, it may be difficult to obtain the solution.

Therefore, the inventors of the present invention have found a MASH type sigma delta AD converter 1 according to a first embodiment, which can execute the highly accurate AD conversion by effectively suppressing the residual quantization error Q1 in the external output signal SO.

Schematic and Problem of MASH Type Sigma Delta AD Converter Device (First Embodiment)

Figure 2:
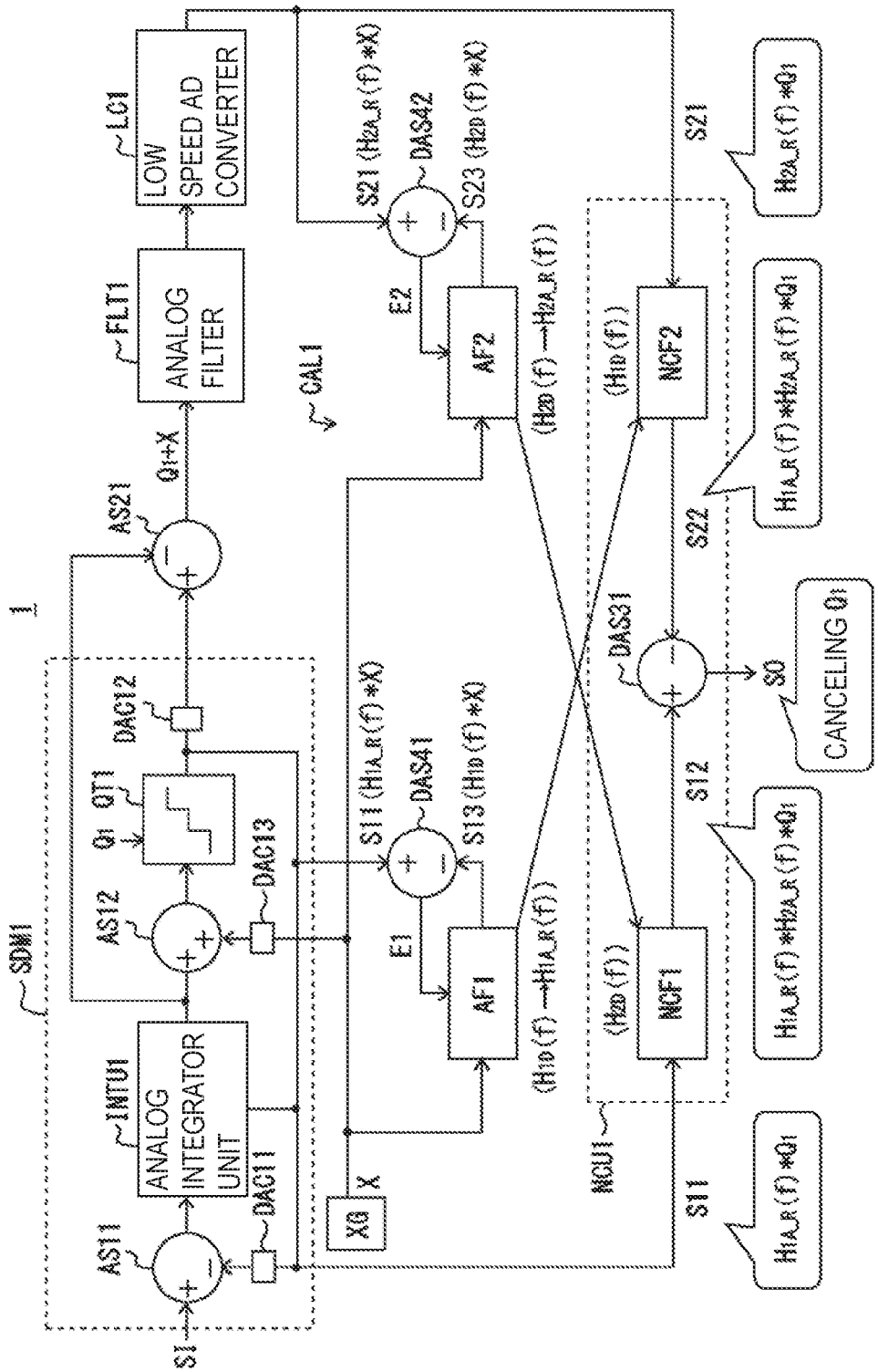
FIG. 2 is a block diagram illustrating a configuration example of a main part of a MASH type sigma delta AD converter device according to the first embodiment.

FIG. 2 is a block diagram illustrating a configuration example of a main part of the MASH type sigma delta AD converter device 1 according to the first embodiment.

As shown in FIG. 2, the MASH type sigma delta AD converter 1 includes a modulator (a sigma delta modulator) SDM1, an analog adder-subtractor AS21, an analog filter FLT1, a low speed AD converter (a first AD converter) LC1, a noise cancellation circuit NCU1, and a calibration circuit CAL1.

The calibration circuit CAL1 includes a probe signal generation circuit XG, a plurality (in this case, two) of adaptive filters AF1 and AF2, and a plurality (in this case, two) of digital adder-subtractors DAS41 and DAS42.

Like the modulator SDM51, the modulator SDM1 includes an analog adder-subtractor AS11, an analog integrator unit INTU1, a quantizer QT1, and DA converter circuits DAC11 and DAC12. The modulator SDM1 further includes an analog adder-subtractor AS12 and a DA converter circuit DAC13.

The DA converter circuit DAC13 converts a probe signal X generated by the probe signal generation circuit XG, which will be described later, into an analog signal and then outputs the analog signal. The analog adder-subtractor AS12 adds an output signal (a component of the probe signal X) of the DA converter circuit DAC13 to an output signal of the analog integrator unit INTU1, and outputs the added signal to the quantizer QT1. Since the rest of the configuration of the modulator SDM1 is the same as that of the modulator SDM51, its explanation is omitted.

The analog adder-subtractor AS21 extracts the component of the probe signal X and a quantization error Q1 generated in the modulator SDM51 by subtracting the output signal of the analog integrator unit INTU1 from an output signal of the modulator SDM1 (an output signal of the DA converter circuit DAC12), and outputs the component of the probe signal X and the quantization error Q1.

The analog filter FLT1 is a low pass filter (an anti-aliasing filter), and suppresses a high-frequency component out of frequency components included in an output signal of the analog adder-subtractor AS21, and passes a low-frequency component. As a result, the low speed AD converter LC1 provided at a latter stage of the analog filter FLT1 can suppress an aliasing noise even at lower sampling frequency, as compared with a case that the analog filter FLT1 is not used.

The low speed AD converter LC1 is a nyquist-type AD converter, converts an output signal of the analog filter FLT1 into a digital signal at a sampling frequency fs/M, which is 1/M (M is an integer of 2 or more) of a sampling frequency (a clock frequency, an operation frequency) fs of the modulator SDM1 in an initial stage, and outputs the digital signal as an output signal S21.

Here, MASH type sigma delta AD converter device 1 includes the analog adder-subtractor AS21, the analog filter FLT1, and the low speed AD converter LC1 instead of the sigma delta modulator SDM52, as compared to the MASH type sigma delta AD converter device 60. As a result, the MASH type sigma delta AD converter device 1 does not need to include the high-speed analog integrator unit INTU2, the quantizer QT2, and the DA converter circuit DAC21. Therefore, the power consumption can be reduced.

The probe signal generation circuit XG generates the probe signal X. The probe signal X is, for example, a pseudo random signal, preferably a 1-bit (binary) pseudo random signal. The probe signal X is converted into the analog signal by the DA converter circuit DAC13 of the modulator SDM1, and the analog signal is input to the quantizer QT1 via the analog adder-subtractor AS12. The probe signal X is also input to the adaptive filters AF1 and AF2 as digital signals.

The adaptive filter AF1 searches for an actual transfer function of the modulator SDM1 by observing an output signal S11 of the modulator SDM1 (quantizer QT1) according to the probe signal X. Specifically, the digital adder-subtractor DAS41 calculates an error between an output signal S13 of the adaptive filter AF1 and the output signal S11 of the modulator SDM1 (quantizer QT1) according to the probe signal X, and outputs the calculation result as an error signal E1. Based on the probe signal X and the error signal E1, the adaptive filter AF1 searches for its own filtering coefficient (a tap coefficient) using the LMS algorithm.

Here, an injection point of the probe signal X and an application point of the quantization error Q1 are substantially the same. Thus, the output signal S11 includes a component of "$H_{1A\_R}(f) \cdot X$" represented by using the actual transfer function $H_{1A\_R}(f)$ of the quantization error Q1. On the other hand, the output signal S13 is represented as "$H_{1D}(f) \cdot X$".

Strictly speaking, the output signal S11 includes a component of the quantization error Q1 and a component of the external input signal SI, as illustrated in explanation of FIG. 27. However, the components of the quantization error Q1 and the external input signal SI can be ignorable, from the viewpoint of an input signal to the adaptive filter AF1 via the digital adder-subtractor DAS41. The adaptive filter AF1 searches for a tap coefficient for minimizing the error between the output signal S11 and the output signal S13. As a result, the transfer function $H_{1D}(f)$ of the adaptive filter AF1 is converged to the transfer function $H_{1A\_R}(f)$.

The adaptive filter AF2 searches for an actual transfer function from the analog adder-subtractor AS21 to the low speed AD converter LC1 via the analog filter FLT1 by observing the output signal S21 of the low speed AD converter LC1 according to the probe signal X. Specifically, the digital adder-subtractor DAS42 calculates an error between the output signal S21 of the low speed AD converter LC1 and an output signal S23 of the adaptive filter AF2 according to the probe signal X, and outputs the calculation result as an error signal E2. Based on the probe signal X and the error signal E2, the adaptive filter AF2 searches for its own filtering coefficient (a tap coefficient) using the LMS algorithm.

Here, the injection point of the probe signal X and the application point of the quantization error Q1 are substantially the same. Thus, the output signal S21 includes a component of "$H_{2A\_R}(f) \cdot X$" represented by using the actual transfer function $H_{2A\_R}(f)$ of the quantization error Q1. On the other hand, the output signal S23 is represented as "$H_{2D}(f) \cdot X$".

Strictly speaking, the output signal S21 includes a component of the quantization error Q1. However, the component of the quantization error Q1 can be ignorable, from the viewpoint of an input signal to the adaptive filter AF2 via the digital adder-subtractor DAS42. The adaptive filter AF2 searches for a tap coefficient for minimizing an error between the output signal S21 and the output signal S23. As a result, the transfer function $H_{2D}(f)$ of the adaptive filter AF2 is converged to the transfer function $H_{2A\_R}(f)$.

The noise cancellation circuit NCU1 includes noise cancellation filters NCF1 and NCF2, and a digital adder-subtractor DAS31. Since the digital adder-subtractor DAS31 is the same configuration as the digital adder-subtractor DAS31 shown in FIG. 27, its explanation is omitted.

The transfer functions of the noise cancellation filters NCF1 and NCF2 are represented as $H_{2D}(f)$ and $H_{1D}(f)$, respectively, similarly to the noise cancellation filters NCF51 and NCF52 shown in FIG. 27. Here, the noise cancellation filter NCF1 is configured to be able to adjust a tap coefficient according to a search result by the adaptive filter AF2. Thereby, the transfer function $H_{2D}(f)$ of the noise cancellation filter NCF1 is adjusted to the transfer function $H_{2A\_R}(f)$. The noise cancellation filter NCF2 is configured to be able to adjust a tap coefficient according to a search result by the adaptive filter AF1. Thereby, the transfer function $H_{1D}(f)$ of the noise cancellation filter NCF2 is adjusted to the transfer function $H_{1A\_R}(f)$.

As a result, the quantization error Q1 is canceled in the external output signal SO. Since the probe signal X is also transmitted through the same path as the quantization error Q 1, it is canceled in the external output signal SO. As a result, as described in FIG. 27, the external output signal SO includes a component of the external input signal SI and a component of a noise shaped quantization error Q2.

The probe signal X is, for example, a 1-bit digital signal indicating two values such as "+0.1" and "−0.1". If a reference voltage is "Vref", the DA converter circuit DAC13 convert the probe signal X into voltage signal such as "+0.1·Vref" and "−0.1·Vref". The probe signal X can also be injected in parallel with the A/D converting process of the external input signal SI (that is, in the background).

In the embodiment, the case where the adaptive filter AF 1 and AF2 and the noise cancellation filter NCF1 and NCF2 are separately provided is described as example, but the present invention is not limited thereto. The adaptive filter AF1 and the noise cancellation filter NCF2 may be integrally formed, or the adaptive filter AF2 and the noise cancellation filter NCF1 may be integrally formed. That is, the adaptive filter AF1 may be used not only as the original function of the adaptive filter AF1 but also as the noise cancellation filter NCF2. The adaptive filter AF2 may be used not only as the original function of the adaptive filter AF2 but also as the noise cancellation filter NCF1.

Details of Analog Integrator Unit

Figure 3:
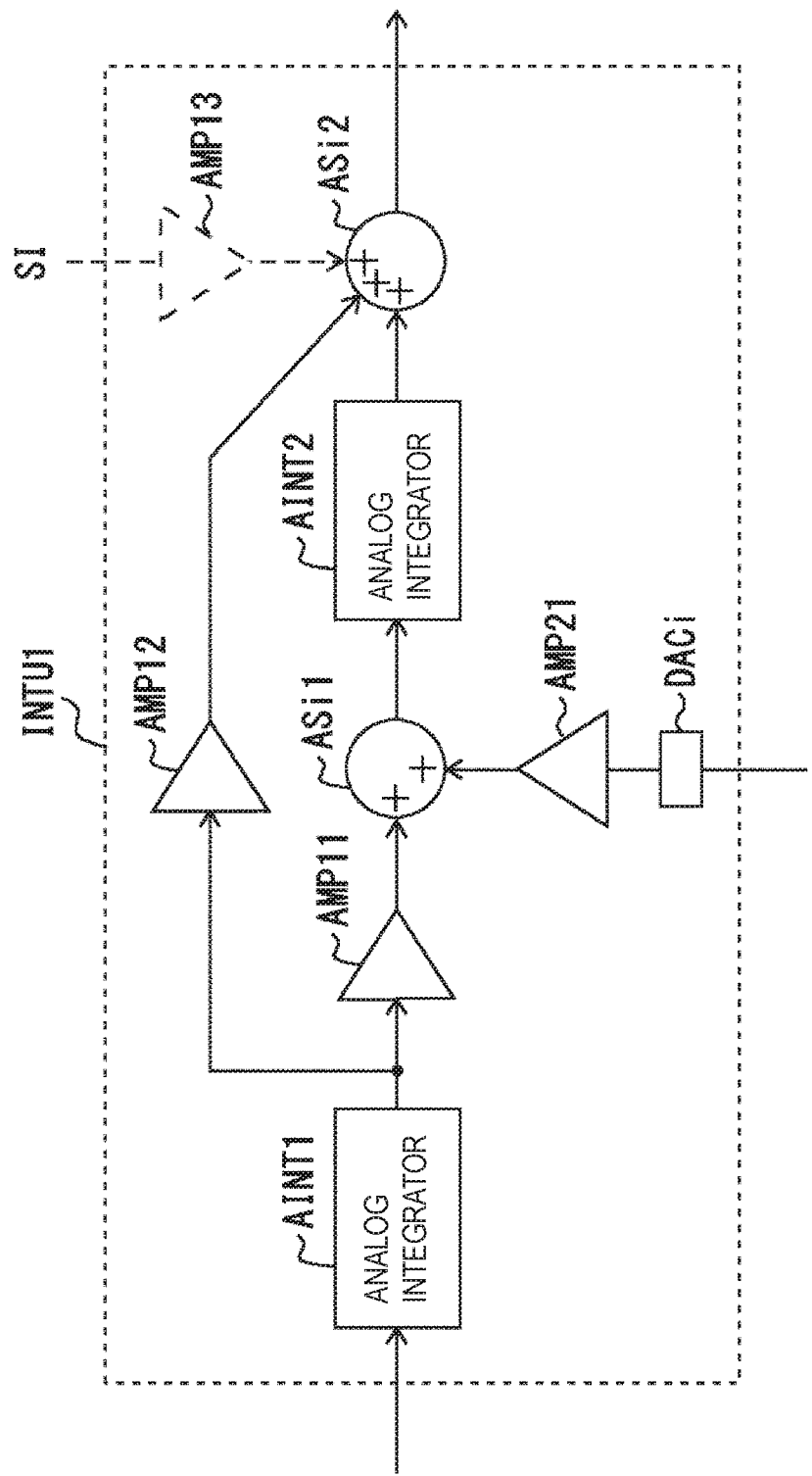
FIG. 3 is a diagram illustrating a configuration example of an analog integrator unit provided in the MASH type sigma delta AD converter device shown in FIG. 2.

FIG. 3 is a diagram illustrating a configuration example of the analog integrator unit INTU1 provided in the MASH type sigma delta AD converter 1.

As shown in FIG. 3, the analog integrator unit INTU1 includes, for example, two (that is, secondary) analog integrators AINT1 and AINT2, analog adder-subtractors ASi1 and ASi2, a DA converter circuit DACi, and amplifier circuits AMP11, AMP12 and AMP21.

The analog integrator AINT1 integrates a calculation result by the analog adder-subtractor AS11 and outputs the resultant signal. The DA converter circuit DACi converts the output signal S11 of the quantizer QT1 into an analog signal and outputs the resultant signal. The analog adder-subtractor ASi1 adds a signal obtained by multiplying an output signal of the analog integrator AINT1 by a predetermined coefficient $\alpha 1$ using the amplifier circuit AMP11, and a signal obtained by multiplying an output signal of the DA converter circuit DACi by a predetermined coefficient $\beta 1$ using the amplifier circuit AMP21, and outputs the resultant signal.

The analog integrator AINT2 integrates a calculation result by the analog adder-subtractor ASi1 and outputs the resultant signal. The analog adder-subtractor ASi2 adds a signal obtained by multiplying the output signal of the analog integrator AINT1 by a predetermined coefficient $\alpha 2$ using the amplifier AMP12 and an output signal of the analog integrator AINT2, and outputs the resultant signal. The analog integrator unit INTU1 outputs an output signal of the analog adder-subtractor ASi2 as the output signal of the analog integrator unit INTU1.

The analog integrator unit INTU1 may further include an amplifier circuit AMP13. In this instance, the analog adder-subtractor ASi2 adds a signal obtained by multiplying the output signal of the analog integrator AINT1 by the predetermined coefficient $\alpha 2$ using the amplifier circuit AMP12, the output signal of the analog integrator AINT2, and a signal obtained by multiplying the external input signal SI by a predetermined coefficient $\alpha 3$ using the amplifier circuit AMP13, for example, and outputs the resultant signal.

Various configurations of the analog integrator unit INTU1 are known, and the configuration of the INTU1 is not limited to the above-described configuration, and the configuration of the INTU1 can be appropriately changed to various configurations having equivalent functions. The degree of the analog integrator unit INTU1 can also be appropriately changed.

First Configuration Example of Analog Integrator Unit

Figure 4:
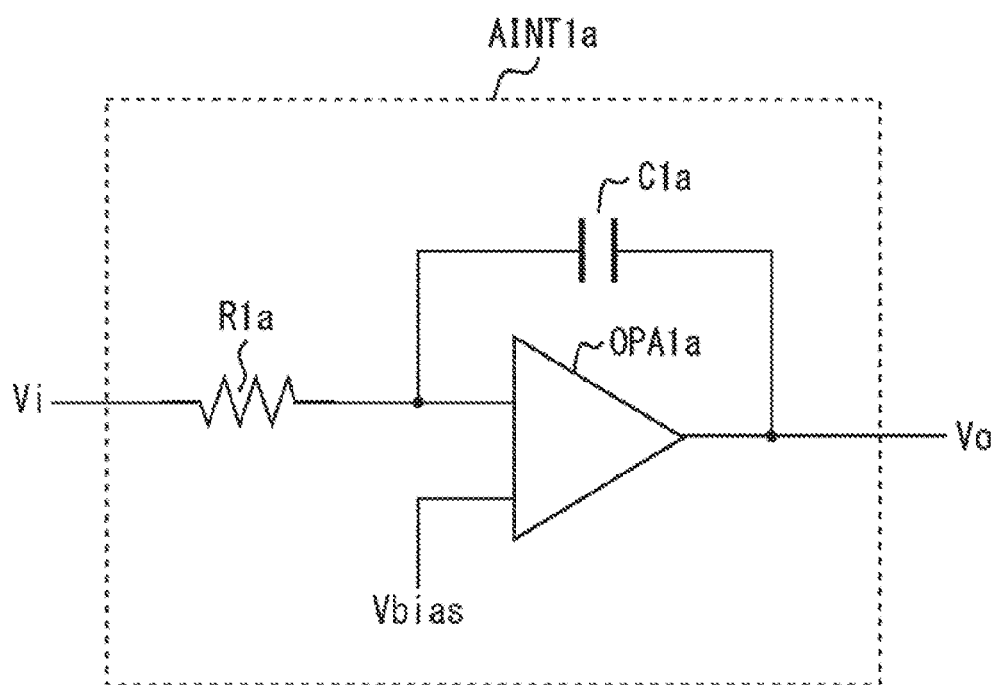
FIG. 4 is a diagram illustrating a first configuration example of an analog integrator provided in the analog integrator unit shown in FIG. 3.

FIG. 4 is a diagram illustrating a first configuration example of the analog integrator AINT1 provided in the analog integrator unit INTU1 shown in FIG. 3 as an analog integrator AINT1$a$. Since the configuration of the analog integrator AINT2 is the same as that of the analog integrator AINT1, its explanation is omitted.

As shown in FIG. 4, the analog integrator AINT1$a$ is an RC type integrator which is one of continuous time type integrator, and includes a resistance element R1$a$, a capacitive element C1$a$, and an operational amplifier OPA1$a$. In the embodiment, the analog integrator AINT1$a$ is a single-ended type, but the present invention is not limited to this, and may be a differential amplifying type.

In the analog integrator AINT1$a$, an input signal (referred to as Vi for convenience sake) is converted into a current by the resistance element R1$a$, and the charges of the current are accumulated in the capacitive element C1$a$. As a result, the integration result of the input signal Vi is obtained as an output signal (referred to as Vo for convenience sake) of the analog integrator AINT1$a$.

If the gain and bandwidth of the operational amplifier OPA1$a$ are both infinite, then the analog integrator AINT1$a$ is the ideal integrator. However, the gain and bandwidth of operational amplifier OPA1$a$ are actually finite. The values of the resistance element R1$a$ and the capacitive element C1$a$ also actually vary from ideal values due to manufacturing variations and the like. Therefore, the actual transfer functions $H_{1A\_R}(f)$ and $H_{2A\_R}(f)$ are different from the transfer functions $H_{1A}(f)$ and $H_{2A}(f)$ in the ideal state.

Therefore, the MASH type sigma delta AD converter device 1 searches for the actual transfer functions $H_{1A\_R}(f)$ and $H_{2A\_R}(f)$ including the effects of the finite gain and the finite bandwidth of the operational amplifier OPA1*a*, and converges the transfer functions $H_{2D}(f)$ and $H_{1D}(f)$ of the noise cancellation filters NCF2 and NCF1 to the transfer functions $H_{1A\_R}(f)$ and $H_{2A\_R}(f)$, respectively. As a result, the MASH type sigma delta AD converter device 1 can effectively suppress the residual quantization error Q1 in the external output signal SO. Therefore, the MASH type sigma delta AD converter device 1 can perform the highly accurate AD conversion. Further, since the demand for the performance of the operational amplifier OPA1*a* is relaxed, the operating current can be reduced.

Second Configuration Example of Analog Integrator Unit

Figure 5:
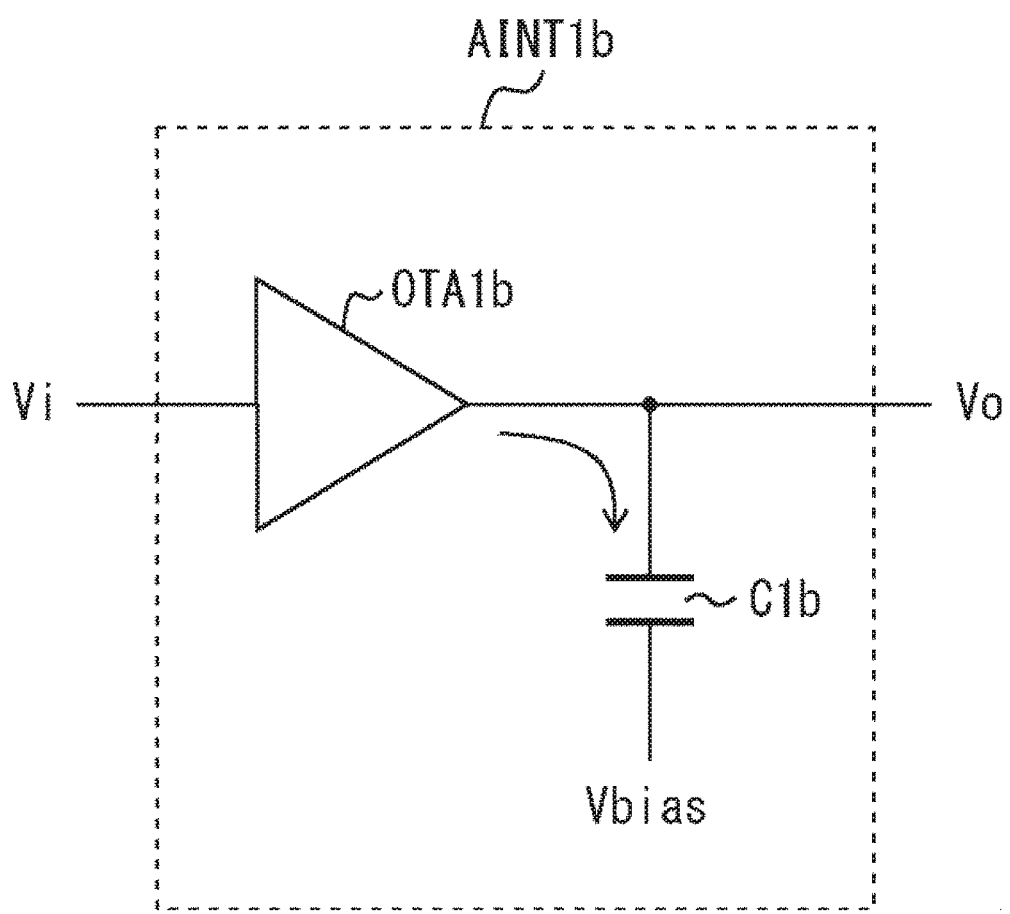
FIG. 5 is a diagram illustrating a second configuration example of an analog integrator provided in the analog integrator unit shown in FIG. 3.

FIG. 5 is a diagram illustrating a second configuration example of the analog integrator AINT1 provided in the analog integrator unit INTU1 shown in FIG. 3 as an analog integrator AINT1*b*. Since the configuration of the analog integrator AINT2 is the same as that of the analog integrator AINT1, its explanation is omitted.

As shown in FIG. 5, the analog integrator AINT1*b* is a current amplifier type integrator, which is one of continuous time type integrator, and includes a current amplifier (a gm amplifier) OTA1*b* and a capacitive element C1*b*. In this embodiment, the analog integrator AINT1*b* is a single-ended type, but the present invention is not limited to this, and may be a differential amplifying type.

In the analog integrator AINT1*b*, an input signal (referred to as Vi for convenience sake) is converted into a current based on the transconductance gm of the current amplifier OTA1*b*, and charges of the current are accumulated in the capacitive element C1*b*. As a result, the integration result of the input signal Vi is obtained as an output signal (referred to as Vo for convenience sake) of the analog integrator AINT1*b*. Generally, the current amplifier type integrator is inferior in linearity in comparison to the RC type integrator, but can reduce current consumption.

If an output resistance of the current amplifier OTA1*b* is infinite, the output resistance of the analog integrator AINT1*b* is an ideal integrator. However, the output resistance of the current amplifier OTA1*b* is actually finite. Also, the values of the capacitive element C1*b* and the transconductance gm actually vary from ideal values due to manufacturing variations and the like. Therefore, the actual transfer functions $H_{1A\_R}(f)$ and $H_{2A\_R}(f)$ are different from the transfer functions $H_{1A}(f)$ and $H_{2A}(f)$ in the ideal state.

Therefore, the MASH type sigma delta AD converter device 1 searches for the actual transfer functions $H_{1A\_R}(f)$ and $H_{2A\_R}(f)$ including the effect of the finite output resistance of the current amplifier OTA1*b*, and converges the transfer functions $H_{2D}(f)$ and $H_{1D}(f)$ of the noise cancellation filters NCF2 and NCF1 to the transfer functions $H_{1A\_R}(f)$ and $H_{2A\_R}(f)$, respectively. As a result, the MASH type sigma delta AD converter device 1 can effectively suppress the residual quantization error Q1 in the external output signal SO. Therefore, the MASH type sigma delta AD converter device 1 can perform the highly accurate AD conversion. Further, since the demand for the performance of the current amplifier OTA1*b* is relaxed, the operating current can be reduced.

Third Configuration Example of Analog Integrator Unit

Figure 6:
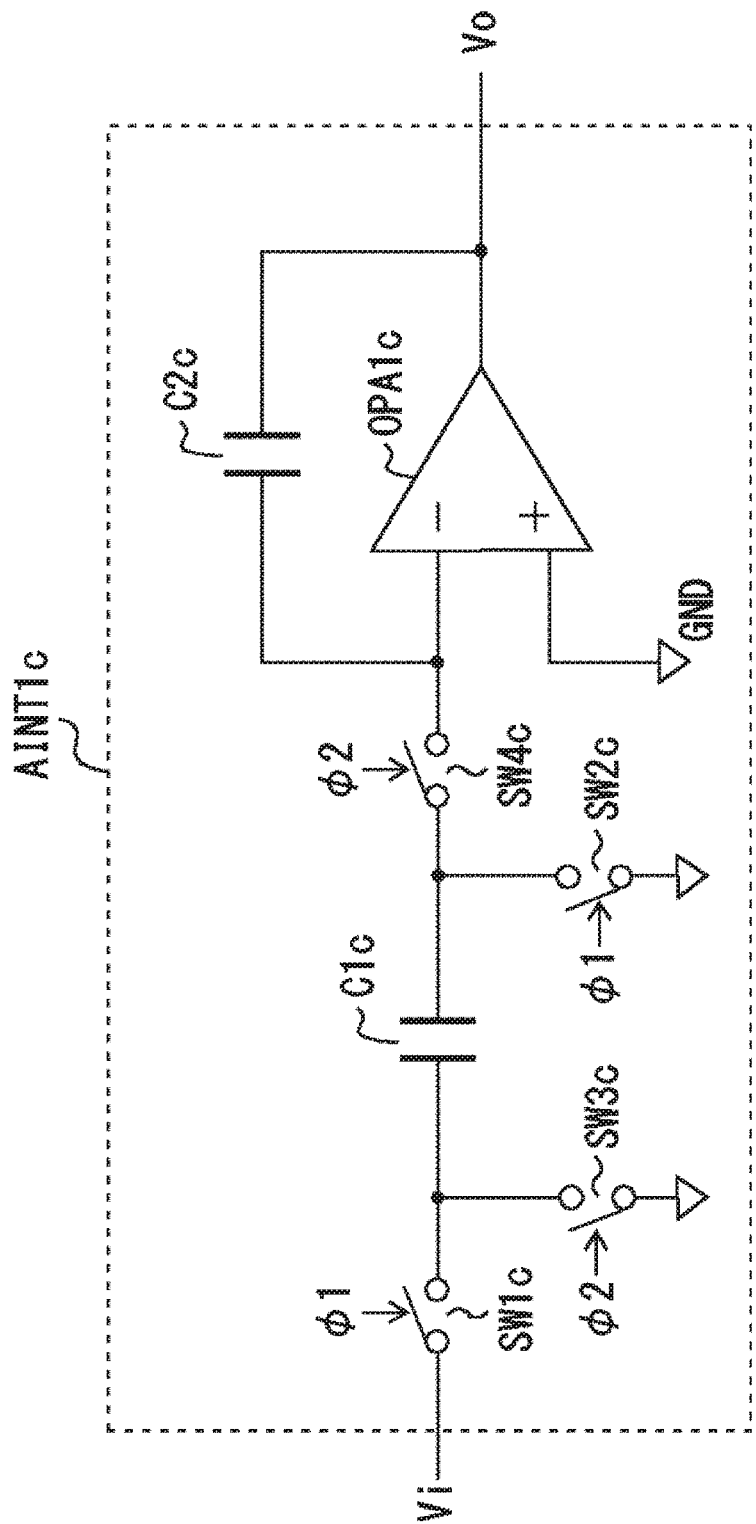
FIG. 6 is a diagram illustrating a third configuration example of an analog integrator provided in the analog integrator unit shown in FIG. 3.

FIG. 6 is a diagram illustrating a third configuration example of the analog integrator AINT1 provided in the analog integrator unit INTU1 shown in FIG. 3 as an analog integrator AINT1*c*. Since the configuration of the analog integrator AINT2 is the same as that of the analog integrator AINT1, its explanation is omitted.

As shown in FIG. 6, the analog integrator AINT1*c* is a discrete time type integrator, and includes switches SW1*c* to SW4*c*, capacitive elements C1*c* and C2*c*, and an operational amplifier OPA1*c*. In the embodiment, the analog integrator AINT1*c* is a single-ended type, but the present invention is not limited to this, and may be of a differential amplifying type.

The switches SW1*c* and SW2*c* are turned on and off by a sampling clock φ1. The switches SW3*c* and SW4*c* are turned on and off by a sampling clock φ2 obtained by inverting the sampling clock φ1.

In the analog integrator AINT1*c*, when the switches SW1*c* and SW2*c* are turned on and the switches SW3*c* and SW4*c* are turned off, an input signal (referred to as Vi for convenience sake) is sampling by the capacitive element C1*c*. When the switches SW1*c* and SW2*c* are turned on and the switches SW3*c* and SW4*c* are turned off, the signal sampled by the capacitive element C1 is transferred to the capacitive element C2*c*. As a result, the integration result of the input signal Vi is obtained as an output signal (referred to as Vo for convenience sake) of the analog integrator AINT1*c*.

If the gain of the operational amplifier OPA1*c* is infinite, and if the excessive response to the output signal Vo is converged at every sampling cycle, the analog integrator AINT1*c* is an ideal integrator. As regards the convergence of the excessive response to the output signal Vo at every sampling cycle, it can be guaranteed by controlling a sufficient current to flow through, for example, the operational amplifier OPA1*c*. However, the gain of the operational amplifier OPA1*c* is actually finite. Therefore, the actual transfer functions $H_{1A\_R}(f)$ and $H_{2A\_R}(f)$ are different from the transfer functions $H_{1A}(f)$ and $H_{2A}(f)$ in the ideal state.

Therefore, the MASH type sigma delta AD converter device 1 searches for the actual transfer functions $H_{1A\_R}(f)$ and $H_{2A\_R}(f)$ including the effect of the finite gain of the operational amplifier OPA1*c*, and converges the transfer functions $H_{2D}(f)$ and $H_{1D}(f)$ of the noise cancellation filters NCF2 and NCF1 to the transfer functions $H_{1A\_R}(f)$ and $H_{2A\_R}(f)$, respectively. As a result, the MASH type sigma delta AD converter device 1 can effectively suppress the residual quantization error Q1 in the external output signal SO. Therefore, the MASH type sigma delta AD converter device 1 can perform the highly accurate AD conversion. Further, since the demand for the performance of the operational amplifier OPA1*c* is relaxed, the operating current can be reduced.

The adaptive filters AF1 and AF2 provided in the MASH type sigma delta AD converter device 1 search for the transfer functions $H_{1A\_R}(f)$ and $H_{2A\_R}(f)$ based on a "z" function, respectively. Here, when the analog integrator unit INTU1 is configured by the discrete time type integrator as shown in FIG. 6, the transfer functions $H_{1A\_R}(f)$ and $H_{2A\_R}(f)$ are defined based on the "z" function. Then, the adaptive filters AF1 and AF2 can accurately search for the transfer functions $H_{1A\_R}(f)$ and $H_{2A\_R}(f)$ itself.

On the other hand, when the analog integrator unit INTU1 is comprised with the continuous time type integrator as shown in FIGS. 4 and 5, the transfer functions $H_{1A\_R}(f)$ and $H_{2A\_R}(f)$ are strictly defined based on a Laplace function (a "s" function). In this instance, the adaptive filters AF1 and AF2 convert the transfer functions $H_{1A\_R}(f)$ and $H_{2A\_R}(f)$ represented by the Laplacian function into the "z" function and search.

Details of Analog Adder-Subtractor

Figure 7:
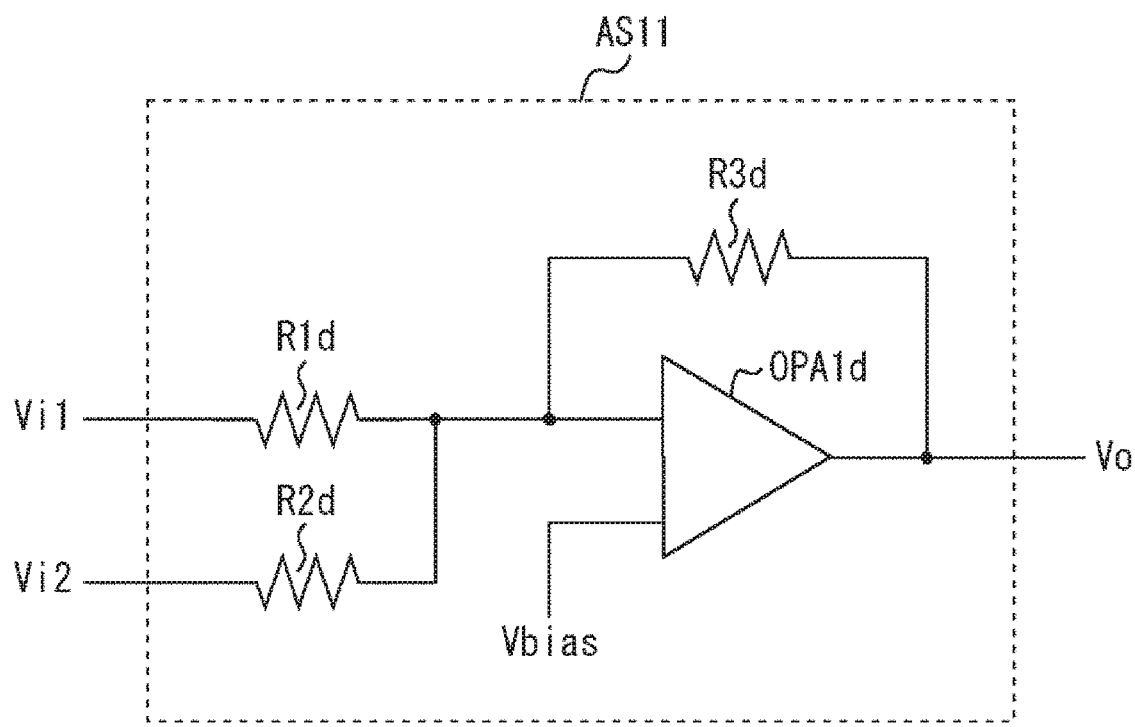
FIG. 7 is a diagram illustrating a configuration example of an analog adder-subtractor provided in the MASH type sigma delta AD converter device shown in FIG. 2.

FIG. 7 is a diagram illustrating a configuration example of the analog adder-subtractor AS11 provided in the MASH type sigma delta AD converter device 1 shown in FIG. 2. The configurations of the analog adder-subtractors AS12 and AS21 are the same as that of the analog adder-subtractor AS11, and therefore its explanation is omitted.

As shown in FIG. 7, the analog adder-subtractor AS11 includes input resistors R1d and R2d, a feedback resistor R3d, and an operational amplifier OPA1d. The two inputs signals (referred to as Vi1 and Vi2 for convenience sake) are converted into currents by the input resistors R1d and R2d, respectively, and their sum current is converted into a voltage by the feedback resistor R1c. As a result, the addition result of the input signals Vi1 and Vi2 is obtained as an output signal (referred to as Vo for convenience sake) of the analog adder-subtractor AS11.

In the embodiment, the analog adder-subtractor AS11 is a single-ended type, but the present invention is not limited to this, and the analog adder-subtractor AS11 may be a differential amplifier type. A reversed polarity input signal (for example, "−Vi2") is also input to the analog adder-subtractor AS11. Thereby, the analog adder-subtractor AS11 can perform a subtraction using the reversed polarity input signal.

If the gain and bandwidth of the operational amplifier OPA1d are both infinite, then the analog adder-subtractor AS11 is an ideal adder-subtractor. At this time, the output signal Vo is expressed by Equation (1).

$$Vo = -(R3d/R1d) \cdot Vi1 - (R3d/R2d) \cdot Vi2 \qquad (1)$$

As can be seen from Equation (1), the weights of the respective additions of the input signals Vi1 and Vi2 are set by the respective resistances of the input resistor signals R1d and R2d.

However, the gain and bandwidth of the actual operational amplifier OPA1d are finite. Therefore, the actual transfer functions $H_{1A\_R}(f)$ and $H_{2A\_R}(f)$ may differ from the transfer functions $H_{1A}(f)$ and $H_{2A}(f)$ in the ideal state even if affected by the analog adder-subtractor AS11.

Therefore, the MASH type sigma delta AD converter device 1 searches for the actual transfer functions $H_{1A\_R}(f)$ and $H_{2A\_R}(f)$ including the effects of the finite gain and the finite bandwidth of the analog adder-subtractor AS11, and converges the transfer functions $H_{2D}(f)$ and $H_{1D}(f)$ of the noise cancellation filters NCF2 and NCF1 to the transfer functions $H_{1A\_R}(f)$ and $H_{2A\_R}(f)$, respectively. As a result, the MASH type sigma delta AD converter device 1 can effectively suppress the residual quantization error Q1 in the external output signal SO. Therefore, the MASH type sigma delta AD converter device 1 can perform the highly accurate AD conversion.

In the analog adder-subtractor AS11, the feedback resistor R3d may be replaced with a feedback capacitor. The analog adder-subtractors AS11, AS12 and AS21 and the analog integrator unit INTU1 provided in the MASH type sigma delta AD converter device 1 can then all be configured using the same type of operational amplifier with feedback capacitance.

Alternatively, the analog adder-subtractor AS11 may be configured as a passive adder-subtractor using a resistance element and a capacitive element without using the operational amplifier OPA1d. However, in this case, since the gain is less than 1, a circuit for compensating the gain is separately required. In addition, the analog adder-subtractor AS11 may be configured in a discrete time type adder-subtractor using a switched capacitor.

Details of Analog Filter

Next, the analog filter FLT1 will be described in detail.

First Specific Configuration Example of Analog Filter

Figure 8:
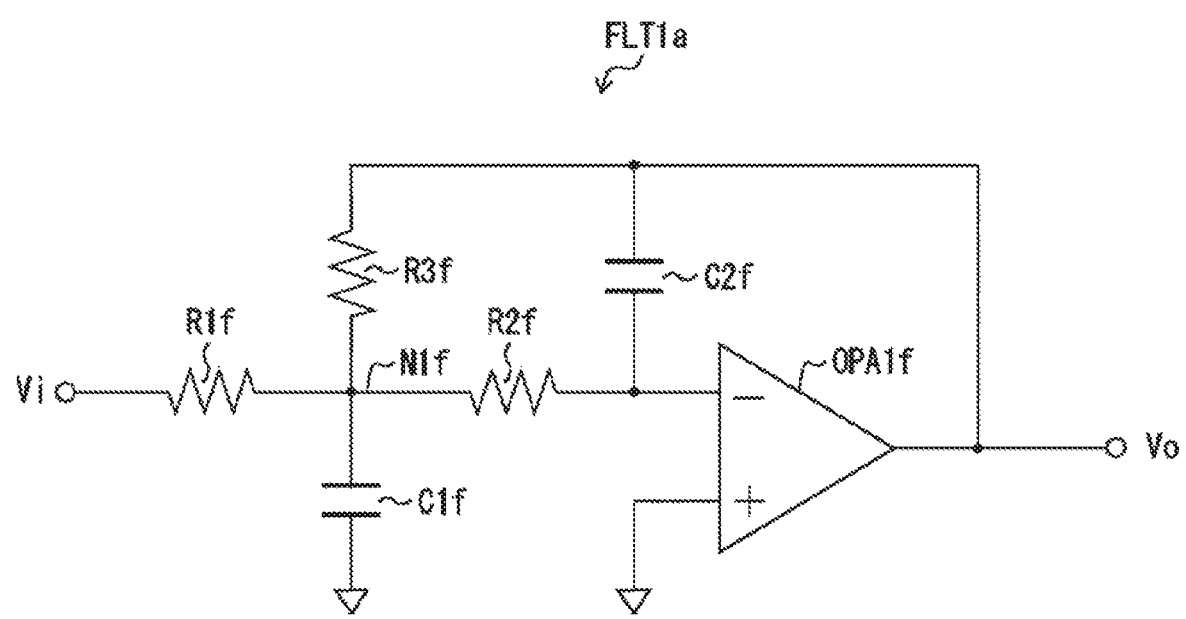
FIG. 8 is a diagram illustrating a first configuration example of an analog filter provided in the MASH type sigma delta AD converter device shown in FIG. 2.

FIG. 8 is a diagram illustrating a first specific configuration example of the analog filter FLT1 as an analog filter FLT1a.

As shown in FIG. 8, the analog filter FLT1a is an operational amplifier feedback type active filter which is one of continuous time type filter, and includes resistance elements R1f to R3f, capacitive elements C1f and C2f, and an operational amplifier OPA1f. In the embodiment, the analog filter FLT1a is described as a single-ended type, but the present invention is not limited to this, and may be a differential amplifying type.

The resistance element R1f is formed between an input terminal to which an input signal (referred to as Vi for convenience sake) is supplied and a node Nif. The resistance element R2f is formed between the node Nif and an inverting input terminal of the operational amplifier OPA1f. The capacitive element C1f is formed between the node Nif and a ground-voltage terminal GND. The resistance element R3f is formed between an output terminal of the operational amplifier OPA1f and the node Nif. The capacitive element C2f is formed between the output terminal and the inverting input terminal of the operational amplifier OPA1f. The non-inverting input terminal of the operational amplifier OPA1f is connected to the ground-voltage terminal GND. As a result, the filtering result of the input signal Vi is obtained as an output signal (referred to as Vo for convenience sake) of the analog filter FLT1.

The gain and bandwidth of the operational amplifier OPA1f are actually finite. The values of resistance elements R1f to R3f and the capacitive elements C1f and C2f also actually vary from ideal values due to manufacturing variations and the like. Therefore, the actual transfer function $H_{2A\_R}(f)$ is different from the transfer function $H_{2A}(f)$ in the ideal state.

Therefore, the MASH type sigma delta AD converter 1 searches for the actual transfer functions $H_{1A\_R}(f)$ and $H_{2A\_R}(f)$ including the effects of the finite gain and the finite bandwidth of the operational amplifier OPA1f, and converges the transfer functions $H_{2D}(f)$ and $H_{1D}(f)$ of the noise cancellation filters NCF2 and NCF1 to the transfer functions $H_{1A\_R}(f)$ and $H_{2A\_R}(f)$, respectively. As a result, the MASH type sigma delta AD converter device 1 can effectively suppress the residual quantization error Q1 in the external output signal SO. Therefore, the MASH type sigma delta AD converter device 1 can perform the highly accurate AD conversion. Further, since the demand for the performance of the operational amplifier OPA1f is relaxed, the operating current can be reduced.

The analog filter FLT1a is not limited to the above-described configuration and can be appropriately changed to another configuration capable of realizing the same function.

Second Specific Configuration Example of Analog Filter

Figure 9:
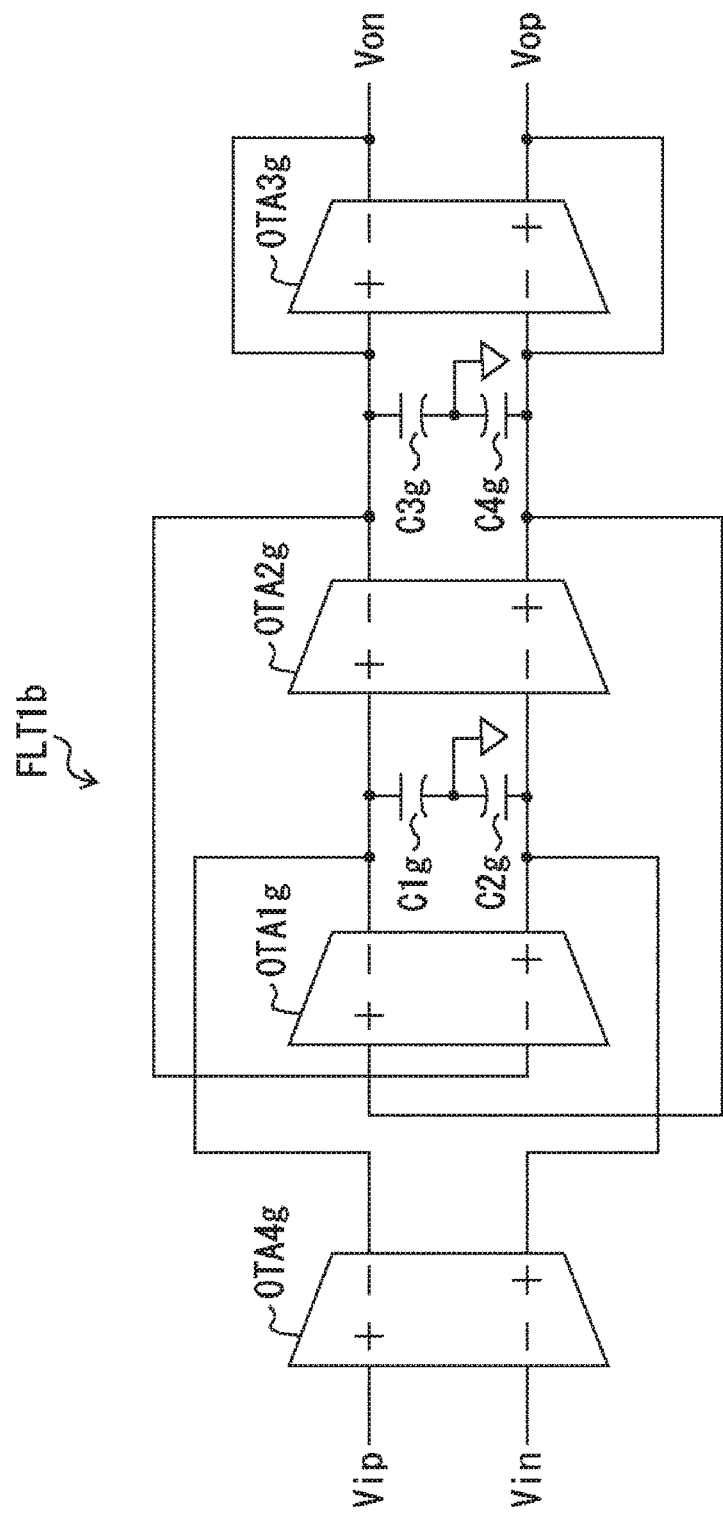
FIG. 9 is a diagram illustrating a second configuration example of an analog filter provided in the MASH type sigma delta AD converter device shown in FIG. 2.

FIG. 9 is a diagram illustrating a second specific configuration example of the analog filter FLT1 as an analog filter FLT1b.

As shown in FIG. 9, the analog filter FLT1b is a Gm-C filter which is one of continuous time type filter and includes differential amplifier type current amplifiers (gm amplifiers) OTA1g to OTA4g and capacitive elements C1g to C4g.

The current amplifier OTA4g converts two input signals (referred to as Vip and Vin for convenience sake) into currents based on a transconductance gm4 of the current amplifier OTA4g. The current amplifier OTA1g converts differential output signals of the current amplifier OTA2g into currents based on a transconductance gm1 of the current amplifier OTA1g. The charges of the inverted output signals of the current amplifiers OTA4g and OTA1g are accumulated in the capacitive element C1g. The charges of the respective non-inverted output signals of the current amplifiers OTA4g and OTA1g are accumulated in the capacitive element C2g.

The current amplifier OTA2g converts a voltage corresponding to the charge accumulated in the capacitive element C1g and a voltage corresponding to the charge accumulated in the capacitive element C2g into currents based on a transconductance gm2 of the current amplifier OTA2g. The current amplifier OTA3g converts a voltage corresponding to the charge accumulated in the capacitive element C3g and a voltage corresponding to the charge accumulated in the capacitive element C4g into currents based on a transconductance gm3 of the current amplifier OTA3g. The charges of the respective inverted outputs of the current amplifiers OTA2g and OTA3g are accumulated in the capacitive element C3g. The charges of the respective non-inverted output signals of the current amplifiers OTA2g and the OTA3g are accumulated in the capacitive element C4g. As a result, the filtering results of the input signals Vip and Vin are obtained as output signals (referred to as Vop and Von for convenience sake) of the analog filter FLT1$b$.

The output resistances of the current amplifiers OTA1g to OTA4g are actually finite. Also, the values of the capacitive elements C1g to C4g and the transconductances gm1 to gm4 actually vary from ideal values due to manufacturing variations and the like. Therefore, the actual transfer function $H_{2A\_R}(f)$ is different from the transfer functions $H_{2A}(f)$ in the ideal state.

Therefore, the MASH type sigma delta AD converter device 1 searches for the actual transfer functions $H_{1A\_R}(f)$ and $H_{2A\_R}(f)$ including the effects of the finite output resistances of the current amplifiers OTA1g to OTA4g, and converges the transfer functions $H_{2D}(f)$ and $H_{1D}(f)$ of the noise cancellation filters NCF2 and NCF1 to the transfer functions $H_{1A\_R}(f)$ and $H_{2A\_R}(f)$, respectively. As a result, the MASH type sigma delta AD converter device 1 can effectively suppress the residual quantization error Q1 in the external output signal SO. Therefore, the MASH type sigma delta AD converter device 1 can perform the highly accurate AD conversion. Further, since the demands on the performance of the current amplifiers OTA1g to OTA4g are relaxed, the operating current can be reduced.

The analog filter FLT1$b$ is not limited to the above-described configuration and can be appropriately changed to another configuration capable of realizing the same function.

Third Specific Configuration Example of Analog Filter

Figure 10:
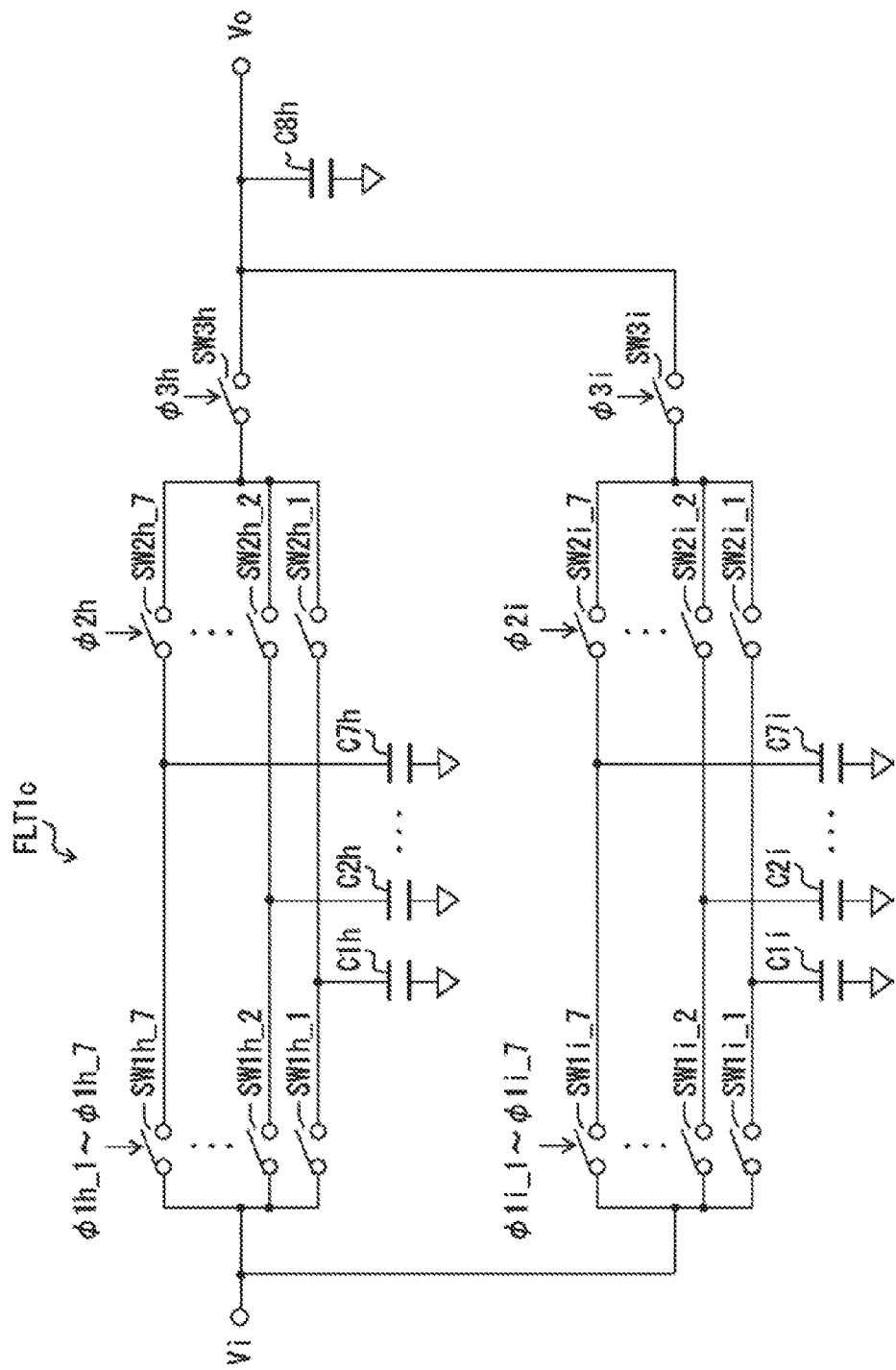
FIG. 10 is a diagram illustrating a third configuration example of an analog filter provided in the MASH type sigma delta AD converter device shown in FIG. 2.
Figure 11:
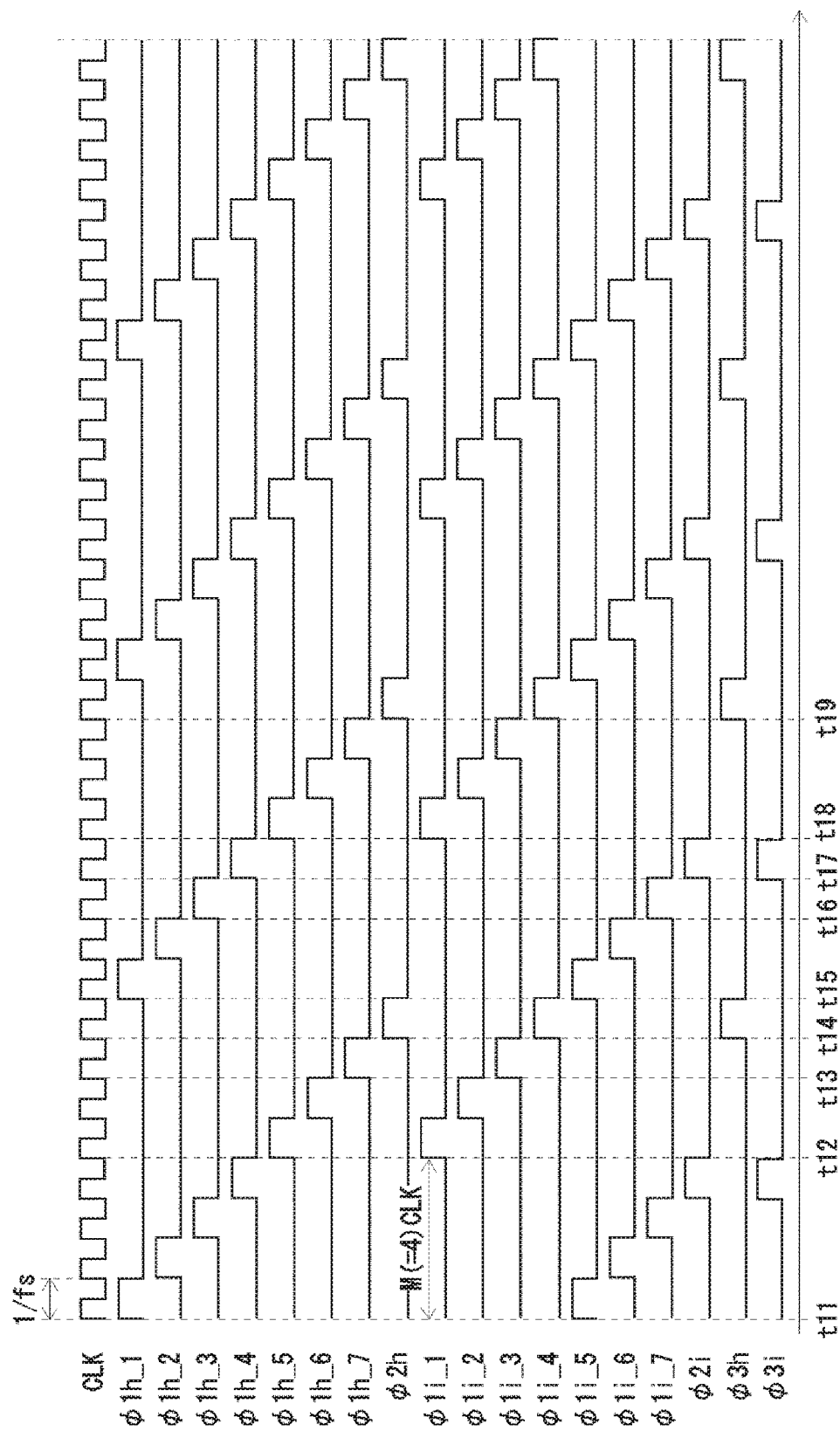
FIG. 11 is a timing chart illustrating an operation of the analog filter shown in FIG. 10.

FIG. 10 is a diagram illustrating a third specific configuration example of the analog filter FLT1 as an analog filter FLT1$c$. FIG. 11 is a timing chart illustrating an operation of the analog filter FLT1$c$.

As shown in FIG. 10, the analog filter FLT1$c$ is a discrete time type filter, and includes switches SW1$h$_1 to SW1$h$_7, switches SW2$h$_1 to SW2$h$_7, switches SW1$i$1 to SW1$i$7, switches SW2$i$1 to SW2$i$7, switches SW3$h$ and SW3$i$, capacitive elements C1$h$ to C7$h$, capacitive elements C1$i$ to C7$i$, and a capacitive element C8$h$. In FIG. 10, the ratio of the capacitance values of the capacitive elements C1$h$ to C7$h$ are 1:2:3:4:3:2:1. The ratio of the capacitance values of the capacitive elements C1$i$ to C7$i$ are 1:2:3:4:3:2:1.

Here, in the embodiment of FIG. 10, two filters are arranged in parallel in order to realize an efficient filtering. A first filter includes the switches SW1$h$_1 to SW1$h$_7, the switches SW2$h$_1 to SW2$h$_7, the switch SW3$h$, the capacitive elements C1$h$ to C7$h$, and the capacitive element C8$h$.

A second filter includes the switches SW1$i$1 to SW1$i$7, the switches SW2$i$1 to SW2$i$7, the switch SW3$i$, the capacitive elements C1$i$ to C7$i$, and the capacitive element C8$h$. The capacitive element C8$h$ is shared by the first and second filters.

First, a filtering according to the first filter is performed. Specifically, in the first filter, control signals φ1$h$_1 to φ1$h$_7 are temporarily set to H level in order, and the switches SW1$h$1 to SW1$h$7 are temporarily turned on in order, whereby charges of the input signal (referred to as Vi for convenience sake) are sequentially accumulated in the capacitive elements C1$h$ to C7$h$ (times t11 to t13). Thereafter, a control signal φ2$h$ is temporarily set to H level and then the switches SW2$h$1 to SW2$h$7 are simultaneously turned on, whereby voltage signals corresponding to the charges accumulated in the capacitive elements C1$h$ to C7$h$ are simultaneously output (time t14). At this time, since a control signal φ3$h$ is temporarily set to H level and then the switch SW3$h$ is turned on. Therefore, the charges of these voltage signals are accumulated in the capacitive element C8$h$ (time t14). Thereafter, a voltage corresponding to the charges accumulated in the capacitive element C8$h$ is output as an output signal (referred to as Vo for convenience sake) of the analog filter FLT1$c$ (times t15 to t17).

Next, in the second filter, after M (here, 4) clock cycles are elapsed from the start of the filtering by the first filter, a filtering is started (time t12).

Specifically, in the second filter, after M (=4) clock cycles are elapsed from the rising of the control signal φ1$h$1 of the first filter, control signals φ1$i$1 to φ1$i$7 are temporarily set to H level in order, and then the switches SW1$i$1 to SW1$i$7 are temporarily turned on in order, whereby charges of the input signal Vi are accumulated in order in the capacitive elements C1$i$ to C7$i$ (times t12 to t16). Thereafter, a control signal φ2$i$ is temporarily set to H level and the switches SW2$i$1 to SW2$i$7 are simultaneously turned on, whereby the voltage signals corresponding to the charges accumulated in the capacitive elements C1$i$ to C7$i$ are simultaneously output (time t17). At this time, since a control signal φ3$i$ is temporarily set to H level and the switch SW3$i$ is turned on, the charges of these voltage signals are accumulated in the capacitive element C8$h$ (time t17). Thereafter, a voltage corresponding to the charges accumulated in the capacitive element C8$h$ is output as the output signal Vo of the analog filter FLT1$c$ (times t18 to t19).

In the first filter, after M (=4) clock cycles from the start of the filtering by the second filtering (that is, after M (=4) clock cycles from the rise of the control signal φ1$i$_1 of the second filter), since the sampling operation has been completed, a following filtering is started. In the first and second filters, such an operation is repeated. Therefore, the filtering result by the analog filter FLT1$c$ is output at a frequency (fs/M), which is 1/M of the clock frequency fs.

In FIG. 10, the number of taps of each filter is 7, but the number of taps is not limited to this. The number of taps of each filter can be arbitrarily set. In FIG. 10, two filters are arranged in parallel, but the present invention is not limited to this. It can be appropriately changed to a configuration in which any number of filters are arranged in parallel. In FIG. 10, the case where M (=4) has been described, but the present invention is not limited thereto. The value of M can be arbitrarily set in accordance with the number of taps of each filter, the number of filters, and the like.

Since the analog filter FLT1$c$ does not include an amplifier, the operating current can be reduced.

Fourth Specific Configuration Example of Analog Filter

Figure 12:
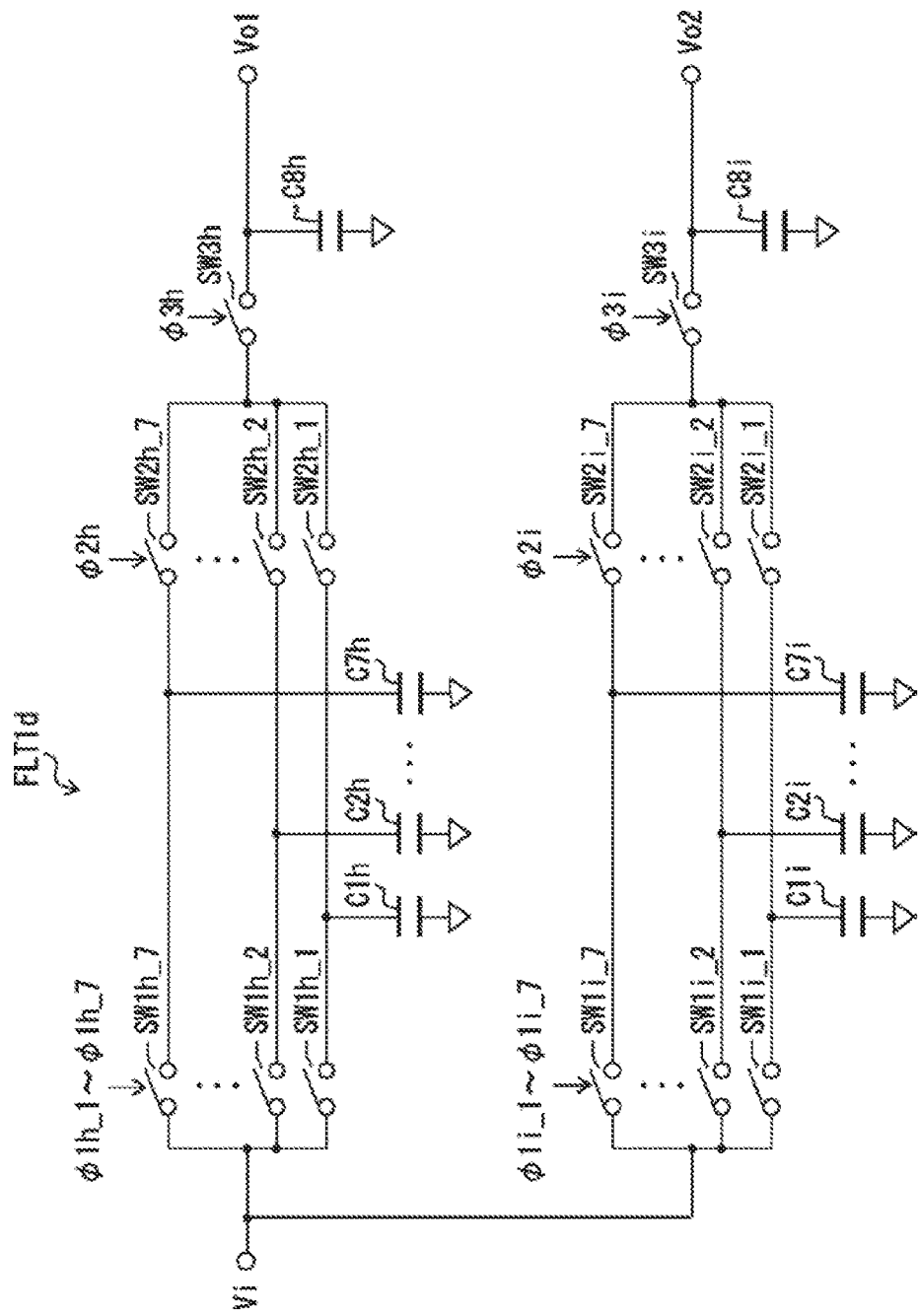
FIG. 12 is a diagram illustrating a fourth configuration example of an analog filter provided in the MASH type sigma delta AD converter device shown in FIG. 2.
Figure 13:
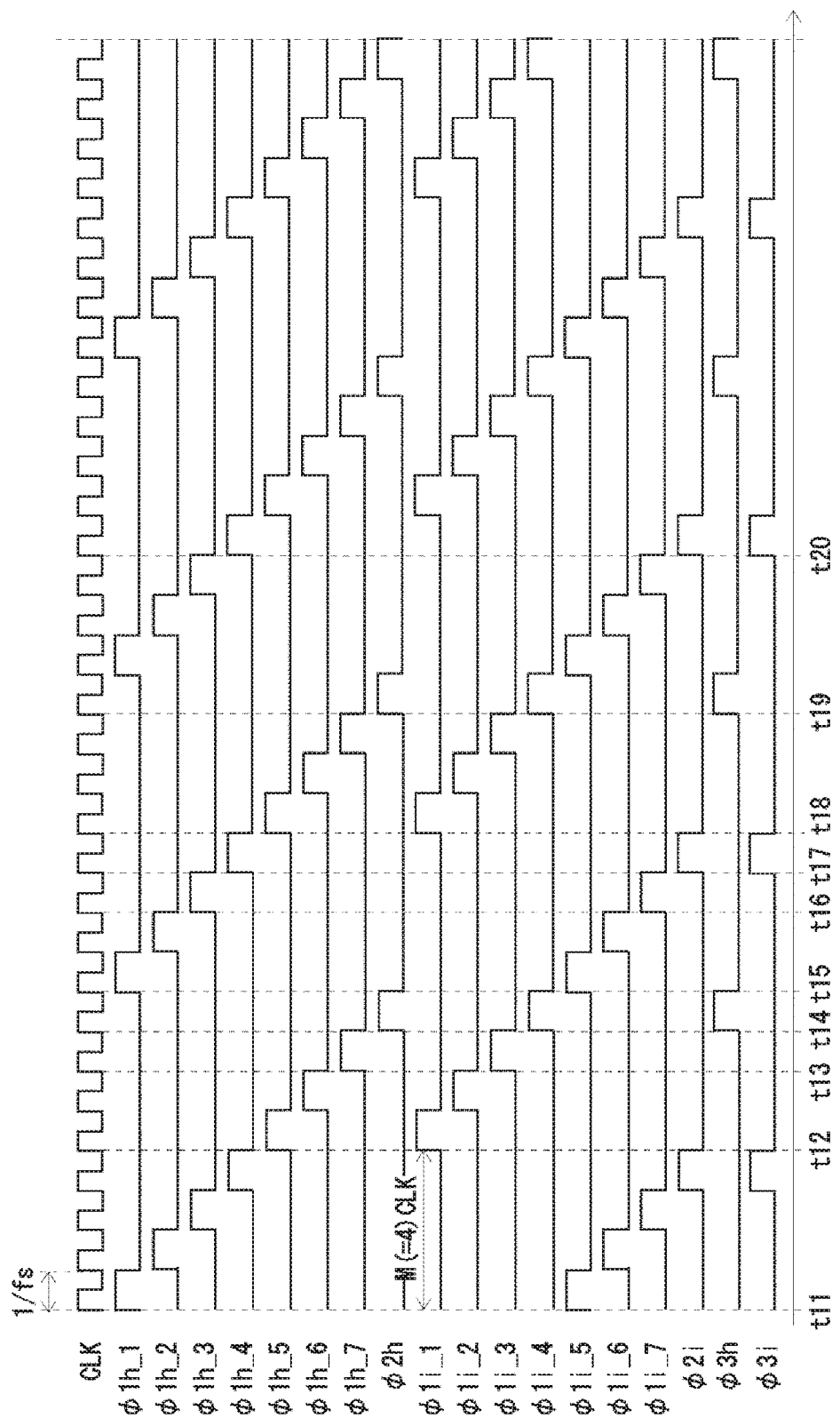
FIG. 13 is a timing chart illustrating an operation of the analog filter shown in FIG. 12.

FIG. 12 is a diagram illustrating a fourth specific configuration example of the analog filter FLT1 as an analog filter FLT1$d$. FIG. 13 is a timing chart illustrating an operation of the analog filter FLT1$d$.

In the analog filter FLT1$c$ shown in FIG. 10, the two filters share the capacitive element C8$h$. On the other hand, in the analog filter FLT1$d$ shown in FIG. 12, each of the two filters has individual capacitive elements C8$h$ and C8$i$. Since the rest of the configuration of the analog filter FLT1$d$ is the same as that of the analog filter FLT1$c$, its explanation is omitted.

Basically, a first filter shown in FIG. 12 performs processing similar to the case of that of the analog filter FLT1$c$. Here, when the switch SW3$h$ is turned on, the charges of the voltage signals corresponding to the charges accumulated in the capacitive elements C1$h$ to C7$h$ are collectively accumulated in the capacitive element C8$h$ (time t14). Thereafter, the voltage corresponding to the charges accumulated in the capacitive element C8$h$ is output as an output signal (referred to as Vo1 for convenience sake) of the analog filter FLT1$d$ (times t15 to t19).

Next, in a second filter shown in FIG. 12, after M (here, 4) clock cycles are elapsed from the start of the filtering by the first filter, a filtering is started (time t12).

Basically, the second filter shown in FIG. 12 performs processing similar to the case of that of the analog filter FLT1$c$ Here, when the switch SW3$i$ is turned on, the charges of the voltage signals corresponding to the charges accumulated in the capacitive elements C1$i$ to C7$i$ are collectively accumulated in the capacitive element C8$i$ (time t17). Thereafter, a voltage corresponding to the charges accumulated in the capacitive element C8$i$ is output as an output signal (referred to as Vo2 for convenience sake) of the analog filter FLT1$d$ (times t18 to t20).

In the first filter, after M (=4) clock cycles from the start of the filtering by the second filter (that is, after M (=4) clock cycles from the rise of the control signal φ1$i$_1 of the second filter), since the sampling operation has been completed, a following filtering is started. In the first and second filters, such an operation is repeated. Therefore, the filtering result by the analog filter FLT1$c$ is output at a frequency (fs/M), which is 1/M of the clock frequency fs.

Since the analog filter FLT1$d$ does not include an amplifier, the operating current can be reduced. Further, in the analog filter FLT1$d$, since the first and second filters have the individual capacitive elements C8$h$ and C8$i$, respectively, the holding time of each sampling result becomes longer as compared with the holding time when the capacitive element C8$h$ is shared. As a result, the low speed AD converter LC1 in the latter stage can take a sufficiently long AD conversion period. Here, the low speed AD converter LC1 is configured to be able to AD conversion of the respective voltages of the capacitive elements C8$h$ and C8$i$ in parallel.

Details of Adaptive Filter

Figure 14:
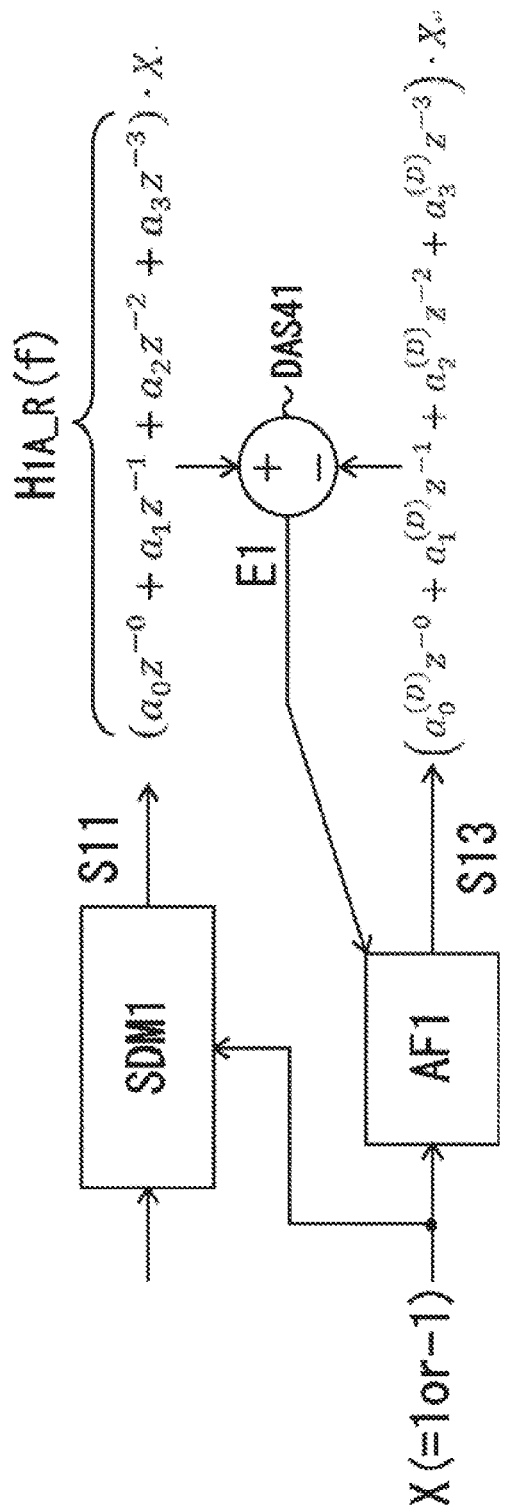
FIG. 14 is a diagram for explaining an operation of one adaptive filter provided in the MASH type sigma delta AD converter device shown in FIG. 2.
Figure 15:
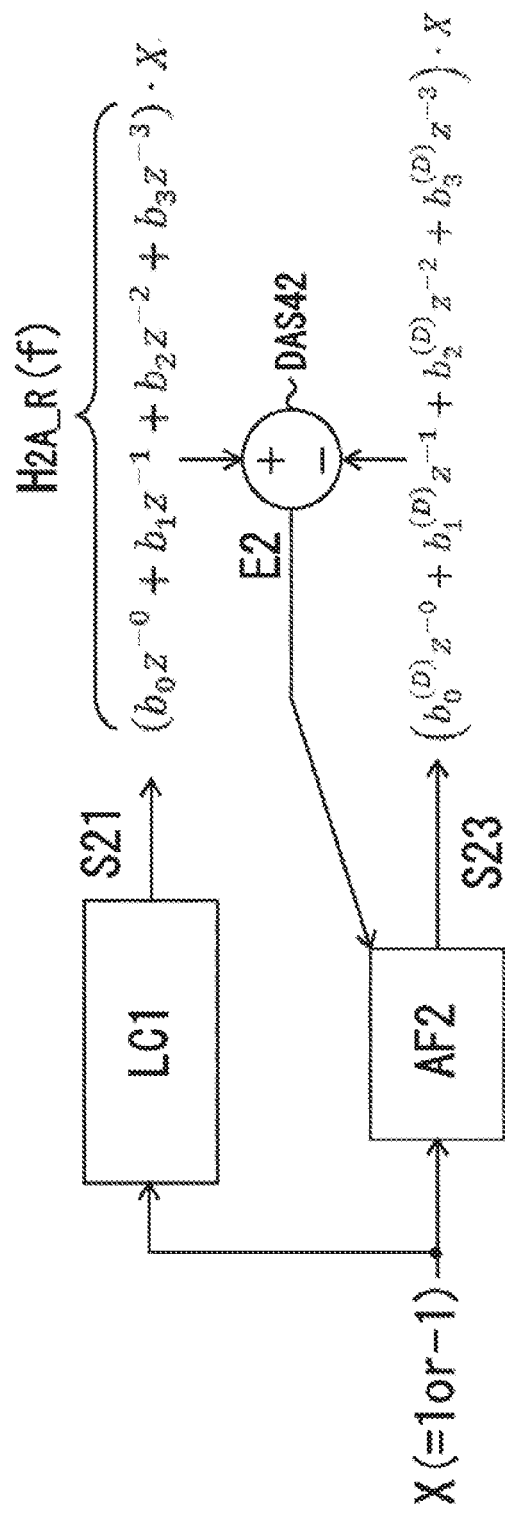
FIG. 15 is a diagram for explaining an operation of the other adaptive filter provided in the MASH type sigma delta AD converter device shown in FIG. 2.

FIGS. 14 and 15 are diagrams for explaining operations of the adaptive filters AF1 and AF2 provided in the MASH type sigma delta AD converter device 1, respectively.

As shown in FIG. 14, the adaptive filter AF1 searches for its filtering coefficient (a tap coefficient) using the LMS algorithm so that the error signal E1 representing a error between the output signal S11 of the modulator SDM1 (quantizer QT1) according to the probe signal X and its own output signal S13 approaches zero.

More specifically, the output signal S11 of the modulator SDM1 according to the probe signal X is represented as "$H_{1A\_R}(f) \cdot X$". Here, the transfer function $H_{1A\_R}(f)$ can be represented as "$a_0 z^{-0} + a_1 z^{-1} + a_2 z^{-2} + a_3 z^{-3}$". On the other hand, the output signal S13 of the adaptive filter AF1 is represented as "$H_{1D}(f) \cdot X$". Here, the transfer function HID (f) is defined as "$a_0^{(D)} z^{-0} + a_1^{(D)} z^{-1} + a_2^{(D)} z^{-2} + a_3^{(D)} z^{-3}$". Therefore, the adaptive filter AF1 searches for "$a_0^{(D)}$", "$a_1^{(D)}$", "$a_2^{(D)}$" and "$a_3^{(D)}$" satisfying "$a_0 = a_0^{(D)}$", "$a_1 = a_1^{(D)}$", "$a_2 = a_2^{(D)}$", "$a_3 = a_3^{(D)}$".

As shown in FIG. 15, the adaptive filter AF2 searches for its own tap coefficient using the LMS algorithm so that the error signal E2 representing an error between the output signal S21 of the low speed AD converter LC1 according to the probe signal X and its own output signal S23 approaches zero.

More specifically, the output signal S21 of the low speed AD converter LC1 according to the probe signal X is represented as "$H_{2A\_R}(f) \cdot X$". Here, the transfer function $H_{2A\_R}(f)$ can be represented as "$b_0 z^{-0} + b_1 z^{-1} + b_2 z^{-2} + b_3 z^{-3}$". On the other hand, the output signal S23 of the adaptive filter AF2 is represented as "$H_{2D}(f) \cdot X$". Here, the transfer function $H_{2D}(f)$ is defined as "$b_0^{(D)} z^{-0} + b_1^{(D)} z^{-1} + b_2^{(D)} z^{-2} + b_3^{(D)} z^{-3}$". Therefore, the adaptive filter AF2 searches for "$b_0^{(D)}$", "$b_1^{(D)}$", "$b_2^{(D)}$" and "$b_3^{(D)}$" satisfying "$b_0 = b_0^{(D)}$", "$b_1 = b_1^{(D)}$", "$b_2 = b_2^{(D)}$" and "$b_3 = b_3^{(D)}$".

Major Effect of MASH Type Sigma Delta AD Converter Device (First Embodiment)

As described above, the MASH type sigma delta AD converter device 1 according to the first embodiment can cancel the quantization error Q1 generated in the quantizer QT1 by using the calibration circuit CAL1. Therefore, the highly accurate AD conversion can be performed. Here, unlike the comparative example shown in FIG. 29, the MASH type sigma delta AD converter device 1 adjusts the transfer function of the noise cancellation filter NCF2 based on the observation result of the output signal of the modulator SDM1, and adjusts the transfer function of the noise cancellation filter NCF1 based on the observation result of the output signal of the low speed AD converter LC1. That is, the MASH type sigma delta AD converter device 1 adjusts one noise cancellation filter based on one observation result. Thereby, since the adjusting process is simplified, the solution can be easily obtained, the accuracy of the solution (in other words, the search accuracy of the adaptive filters AF1 and AF2) can be increased.

The MASH type sigma delta AD converter device 1 according to the first embodiment includes the analog adder-subtractor AS21, the analog filter FLT1, and the low speed AD converter LC1 instead of the sigma delta modulator SDM2 in a latter stage of the sigma delta modulator SDM1 in the initial stage. As a result, the MASH type sigma delta AD converter device 1 does not need to include the quantizer QT2, the DA converter circuit DAC21 and the analog integrator unit INTU2 that need to operate at high speed. Therefore, the power consumption can be reduced.

Further, the MASH type sigma delta AD converter device 1 according to the first embodiment is not limited to the characteristic variation of the analog integrator, and the quantization error Q1 can be canceled by using the noise cancellation filters NCF1 and NCF2 even in a situation in which the characteristic variations of various other circuits (for example, a characteristic variation of the analog adder-subtractor, a characteristic variation due to a reference voltage mismatch between the quantizer and the DA converter circuit, and the like) exists.

Further, unlike the comparative example shown in FIG. 29, the MASH type sigma delta AD converter device 1 according to the first embodiment can perform the searching operation of the adaptive filters AF1 and AF2 in parallel with (that is, in the background) the execution of the A/D conversion for the external input signal SI. Thereby, even when the characteristics of the various circuits are changed due to, for example, a variation in the use environment, the quantization error Q1 can be quickly cancelled by using the noise cancellation filters NCF1 and NCF2.

Modified Example of MASH Type Sigma Delta AD Converter Device

Figure 16:
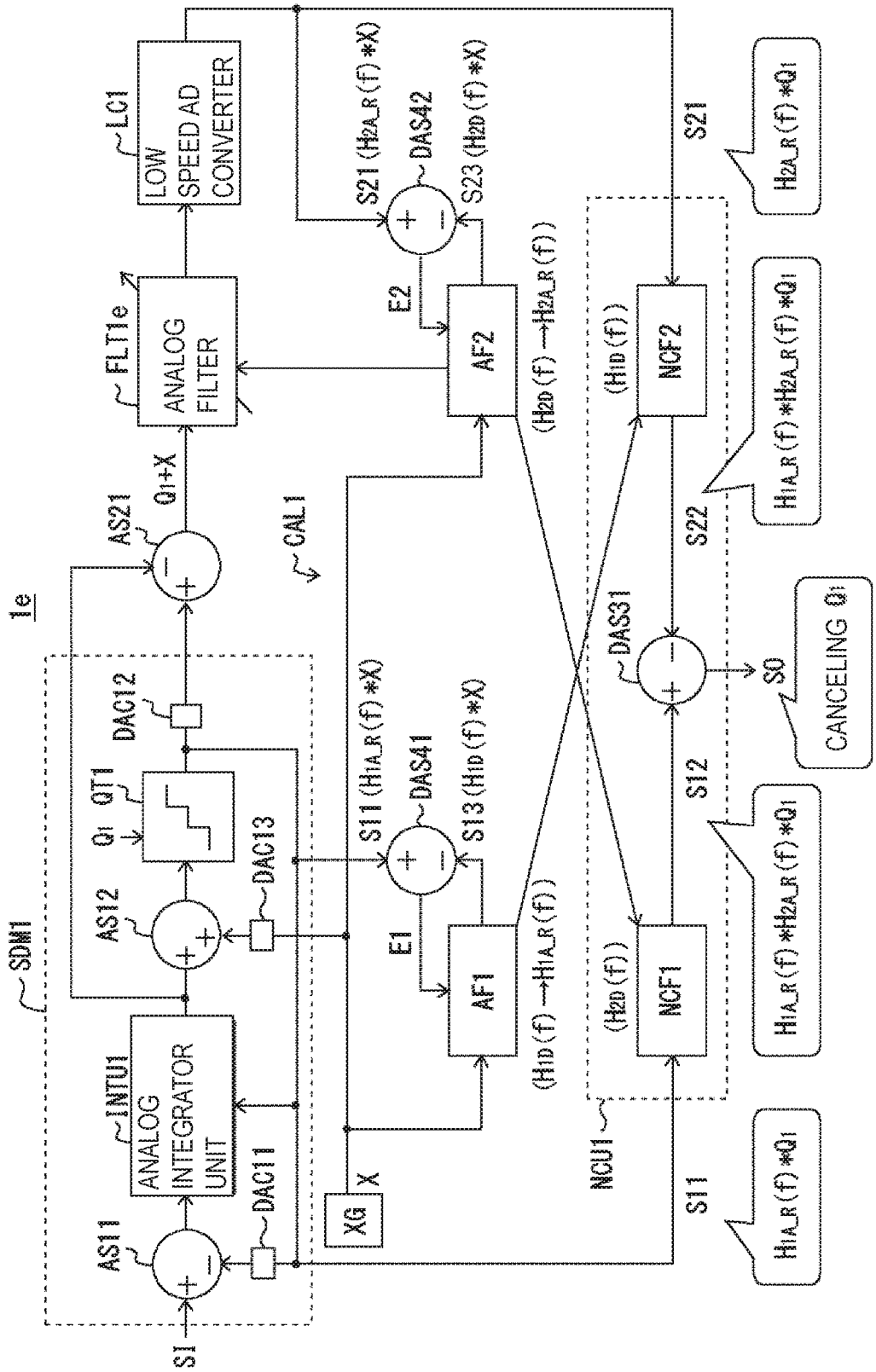
FIG. 16 is a diagram illustrating a modified example of the MASH type sigma delta AD converter device shown in FIG. 2.

FIG. 16 is a diagram illustrating a modified example of the MASH type sigma delta AD converter device 1 as a MASH type sigma delta AD converter 1e.

As shown in FIG. 16, the MASH type sigma delta AD converter device 1e includes an analog filter FLT1e as the modified example of the analog filter FLT1. The analog filter FLT1e is configured to be able to adjust a frequency characteristic in accordance with the search result of the actual transfer function $H_{2A\_R}(f)$ by the adaptive filter AF2 (in other words, the search result of the filtering coefficient of the adaptive filter AF2 itself). Since the rest of the configuration of the MASH type sigma delta AD converter 1e is the same as that of the MASH type sigma delta AD converter device 1, its explanation is omitted.

Figure 17:
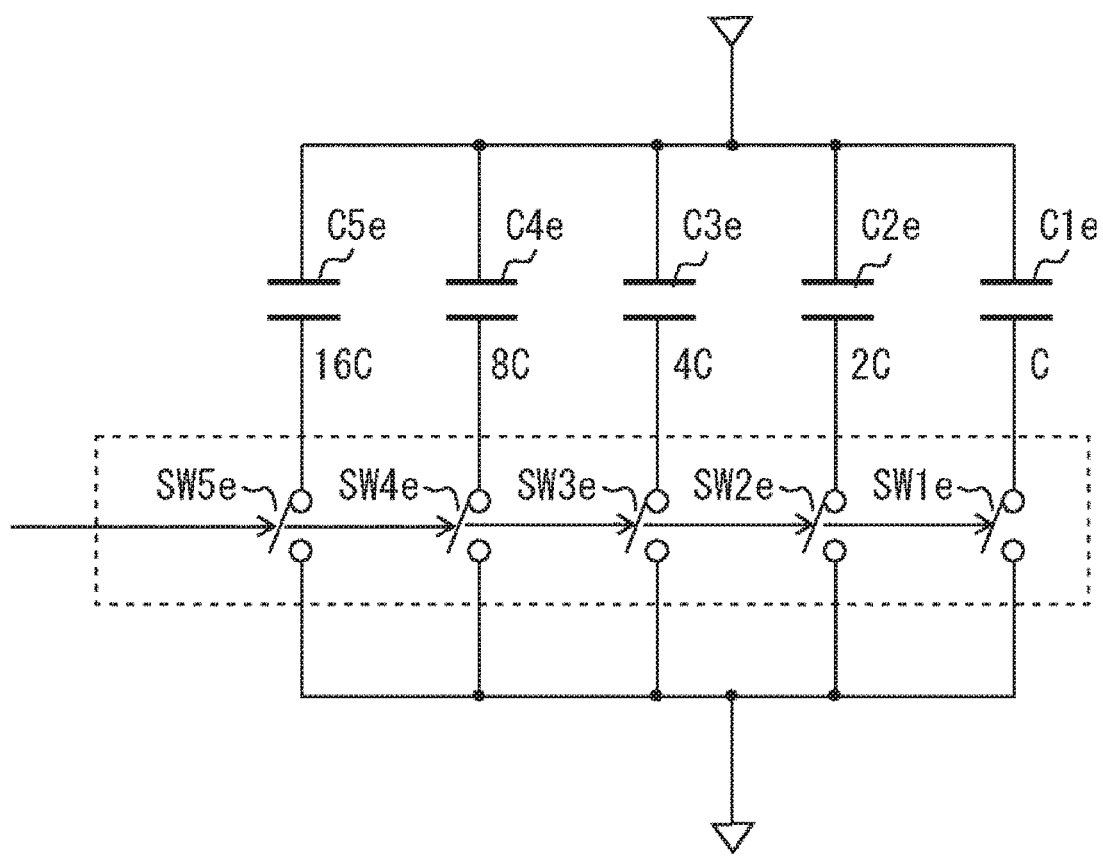
FIG. 17 is a diagram illustrating a configuration example of respective capacitive elements comprising an analog filter provided in the MASH type sigma delta AD converter device shown in FIG. 16.

FIG. 17 is a diagram illustrating a configuration example of respective capacitive elements comprising the analog filter FLT1e. As shown in FIG. 17, each capacitive element provided in the analog filter FLT1e has a plurality of capacitors C5e to C1e with binary-weighted capacitance values, and a plurality of switches SW5e to SW1e provided in series to each of the plurality of capacitors C5e to C1e, and is configured to be able to adjust the capacitance values. Here, the capacitance values of the respective capacitive elements are initially set so as to indicate intermediate values, and are adjusted the search result by the adaptive filter AF2.

The MASH type sigma delta AD converter device 1e can achieve effect equivalent to effect of the MASH type sigma delta AD converter device 1, and can suppress an increase in noise and a decrease in a signal band by adjusting the frequency characteristic of the analog filter FLT1e.

Second Embodiment

Figure 18:
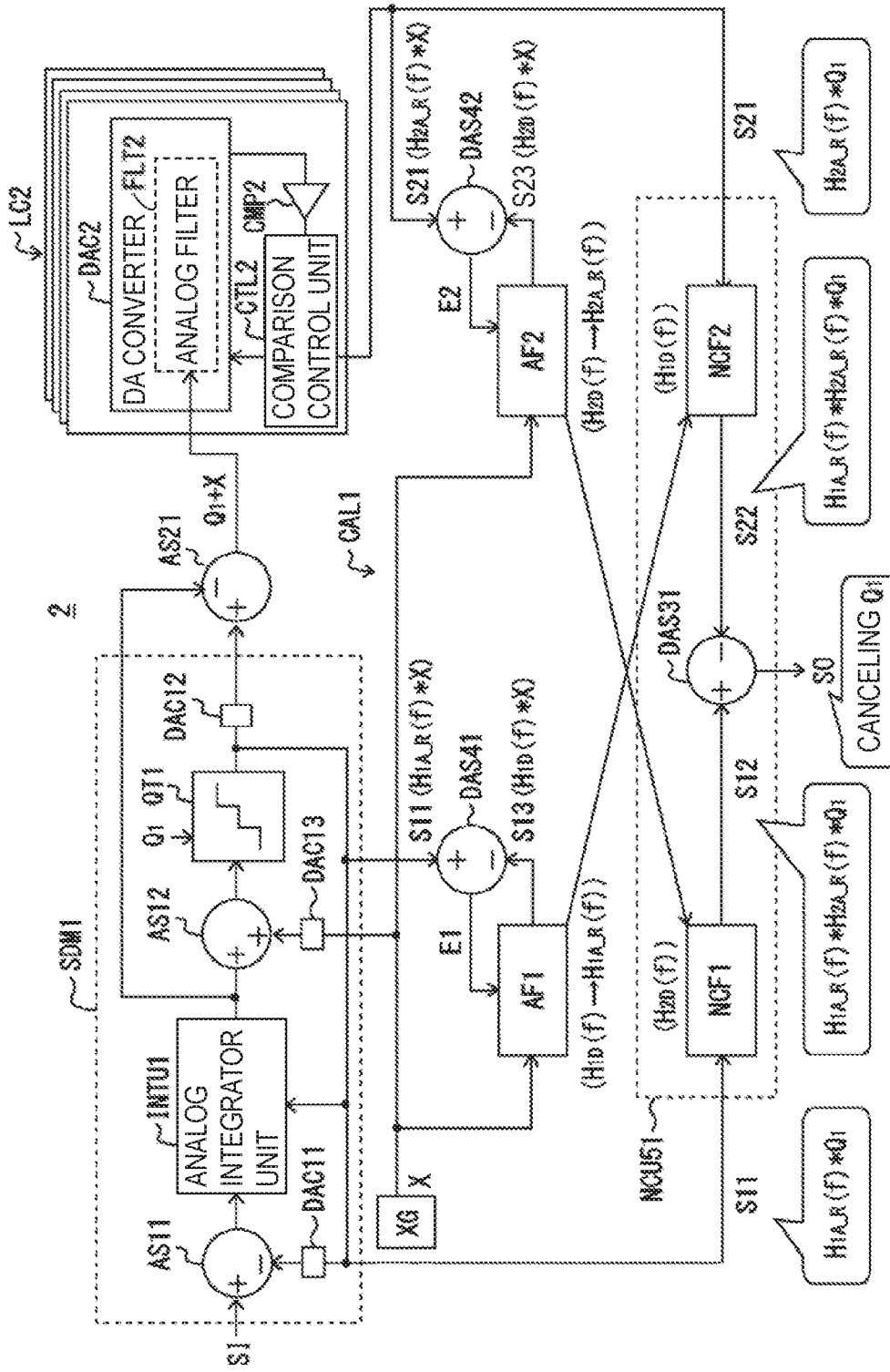
FIG. 18 is a block diagram illustrating a configuration example of a main part of a MASH type sigma delta AD converter device according to a second embodiment.

FIG. 18 is a block diagram illustrating a configuration example of a main part of a MASH type sigma delta AD converter device 2 according to a second embodiment.

As shown in FIG. 18, the MASH type sigma delta AD converter device 2 includes an analog filter FLT2 and a low speed AD converter LC2 instead of the analog filter FLT1 and the low speed AD converter LC1 as compared with the MASH type sigma delta AD converter device 1.

The low speed AD converter LC2 is a successive approximation AD converter, and the analog filter FLT2 is comprised with a capacitive element provided in the low speed AD converter LC2. In other words, the analog filter FLT2 and the low speed AD converter LC2 share the capacitive element. In FIG. 18, the low speed AD converter LC2 is comprised with four successive approximation AD converters arranged in parallel.

Details of Low Speed AD Converter

Figure 19:
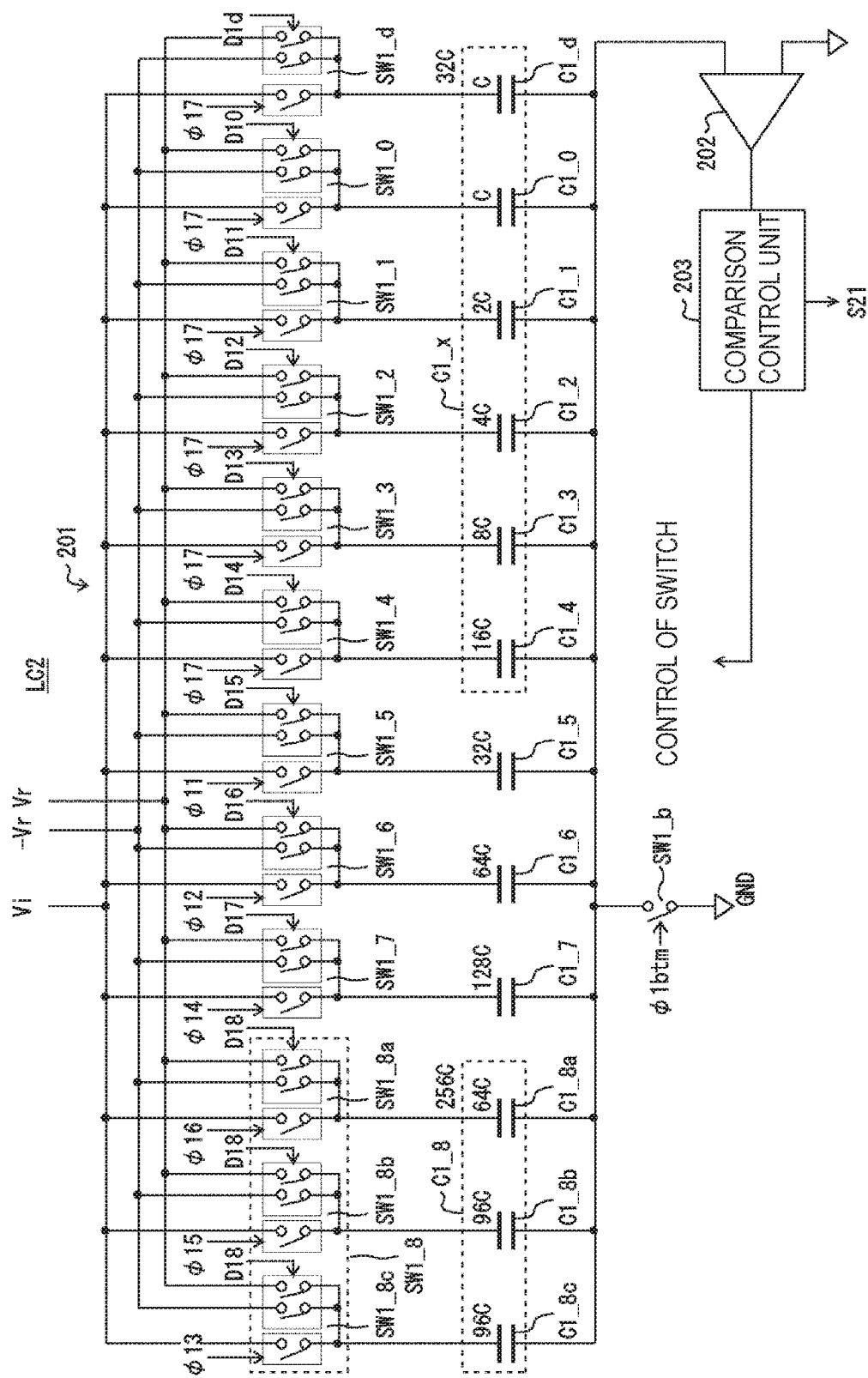
FIG. 19 is a diagram illustrating a configuration example of a low speed AD converter provided in the MASH type sigma delta AD converter device shown in FIG. 18.

FIG. 19 is a diagram illustrating a configuration example of the low speed AD converter LC2. In FIG. 19, one of the four successive approximation AD converters and an analog filter corresponding thereto are shown. In the embodiment, although the successive approximation AD converter is a single-ended type, the present invention is not limited to this, and may be of a differential amplifying type.

As shown in FIG. 19, the low speed AD converter LC2 includes a DA converter 201, a comparator 202, and a comparison control unit 203. The DA converter 201 converts a digital signal successively output from the comparison control unit 203 into an analog voltage Via with a range from a lower limit value "−Vr" to an upper limit value "+Vr" as a full scale. The DA converter 201 also includes a function as a sample-hold circuit for sampling and holding an input voltage (referred to as Vi for convenience sake). The comparator 202 compares the input voltage Vi held by the sample-hold function of the DA converter 201 with the analog voltage Via resulting from the AD conversion by the DA converter 201, and outputs the comparison result. The comparison control unit 203 switches a value of the digital signal based on the comparison result by the comparator 202. By repeating such an operation, the value of the digital signal corresponding to the analog voltage Via indicating a value closest to the input voltage Vi is determined. The low speed AD converter LC 2 outputs the digital signal as the output signal S21.

More specifically, the DA converter 201 includes a plurality of capacitive elements C1_8 to C1_0 with binary-weighted capacitance values from an upper bit to a lower bit, a dummy capacitive element C1_d with the same capacitance value as the capacitive element C1_0 of the least significant bit, a plurality of switches SW1_8 to SW1_0 and SW1_d provided in series to each of the capacitive elements C1_8 to C1_0 and C1_d, and a switch SW 1_b. The switch SW 1_b is provided between a ground voltage terminal GND and a node between the comparator 202 and electrodes (electrodes on a side of the comparator 202) on one side of the capacitive elements C1_8 to C 1_0 and C1_d.

In FIG. 19, the capacitance values of the capacitive elements C1_8 to C1_0 and C1_d indicate 256C, 128C, 64C, 32C, 16C, 8C, 4C, 2C, C and C, respectively. That is, the ratio of the capacitance values of the capacitive elements C1_8 to C1_0 and C1_d is $2^8:2^7:2^6:2^5:2^4:2^3:2^2:2^1:2^0:2^0$.

The switches SW1_8 to SW1_0, SW1_d and SW1_b are controlled by the comparison control unit 203 based on an operation mode and a value of digital signal to be DA-converted. For example, the switch SW1_8 supplies either the voltage "+Vr" or the voltage "−Vr" to electrodes on the other side of the capacitive element C1_8 or stops the supply, by a control signal D18. The switch SW1_7 supplies either the voltage "+Vr" or the voltage "−Vr" to an electrode on the other side of the capacitive element C1_7 or stops the supply, by a control signal D17. The switch SW1_6 supplies either the voltage "+Vr" or the voltage "−Vr" to an electrode on the other side of the capacitive element C1_6 or stops the supply, by a control signal D16. The switch SW1_5 supplies either the voltage "+Vr" or the voltage "−Vr" to an electrode on the other side of the capacitive element C1_5 or stops the supply, by a control signal D15. The switch SW1_4 supplies either the voltage "+Vr" or the voltage "−Vr" to an electrode on the other side of the capacitive element C1_4 or stops the supply, by a control signal D14. The switch SW1_3 supplies either the voltage "+Vr" or the voltage "−Vr" to an electrode on the other side of the capacitive element C1_3 or stops the supply, by a control signal D13. The switch SW1_2 supplies either the voltage "+Vr" or the voltage "−Vr" to an electrode on the other side of the capacitive element C1_2 or stops the supply, by a control signal D12. The switch SW1_1 supplies either the voltage "+Vr" or the voltage "−Vr" to an electrode on the other side of the capacitive element C1_1 or stops the supply, by a control signal D11. The switch SW1_d supplies either the voltage "+Vr" or the voltage "−Vr" to an electrode on the other side of the capacitive element C1_d or stops the supply, by a control signal Did. The switch SW1_b is turned on and off by a control signal φ1btm.

In FIG. 19, the capacitive element C1_8 is comprised with three capacitive elements C1_8a to C1_8c arranged in parallel. The capacitance values of the capacitive elements C1_8a to C1_8c are 96C, 96C, and 64C, respectively. The switch SW 1_8 is comprised with switches SW1_8a to SW1_8c provided in series with the capacitive elements C1_8a to C1_8c, respectively.

Here, in FIG. 19, the configuration of the analog filter FLT2 is realized by using the capacitive elements C1_8 to C1_0 and C1_d provided in the successive approximation AD converter. Specifically, the capacitive element C1h in FIG. 10 is configured by the capacitive element C1_5 of the capacitance value 32C. The capacitive element C2h in FIG. 10 is configured by the capacitive element C1_6 of the capacitance value 64C. The capacitive element C3h in FIG. 10 is configured by the capacitive element C1_8c of the capacitance value 96C. The capacitive element C4h in FIG. 10 is configured by the capacitive element C1_7 of the capacitance value 128C. the capacitive element C5h in FIG. 10 is configured by the capacitive element C1_8b of the capacitance value 96C. The capacitive element C6h in FIG. 10 is configured by the capacitive element C1_8a of the capacitance value 64C. the capacitive element C7h in FIG. 10 is configured by a capacitive element C1_x composed of the capacitive elements C1_4 to C1_0 and C1_d of a total capacitance value 32C.

That is, when the supply of the voltages "+Vr" and "−Vr" to the capacitive element C1_5 is stopped, the switch SW1_5 switches presence or absences of a supply of the input voltage Vi to the capacitive element C1_5 by a control signal φ11. When the supply of the voltages "+Vr" and "−Vr" to the capacitive element C1_6 is stopped, the switch SW1_6 switches presence or absence of a supply of the input voltage Vi to the capacitive element C1_6 by a control signal φ12. When the supply of the voltages "+Vr" and "−Vr" to the capacitive element C1_8c is stopped, the switch SW1_8c switches presence or absence of a supply of the input voltage Vi to the capacitive element C1_8c by a control signal φ 13. When the supply of the voltages "+Vr" and "−Vr" to the capacitive element C1_7 is stopped, the switch SW1_7 switches presence or absence of a supply of the input voltage Vi to the capacitive element C1_7 by a control signal φ14. When the supply of the voltages "+Vr" and "−Vr" to the capacitive element C1_8b is stopped, the switch SW1_8b switches presence or absence of a supply of the input voltage Vi to the capacitive element C1_8b by a control signal φ15. When the supply of the voltages "+Vr" and "−Vr" to the capacitive element C1_8a is stopped, the switch SW1_8a switches presence or absence of a supply of the input voltage Vi to the capacitive element C1_8a by a control signal φ16. When the supply of the voltages "+Vr" and "−Vr" to the capacitive element C1_x is stopped, the switches SW1_4 to SW1_0 and SW1_d switch presence or absence of a supply of the input voltage Vi to the capacitive element C1_x by a control signal φ17. Thereby, the filtering by the analog filter FLT2 can be realized.

Figure 20:
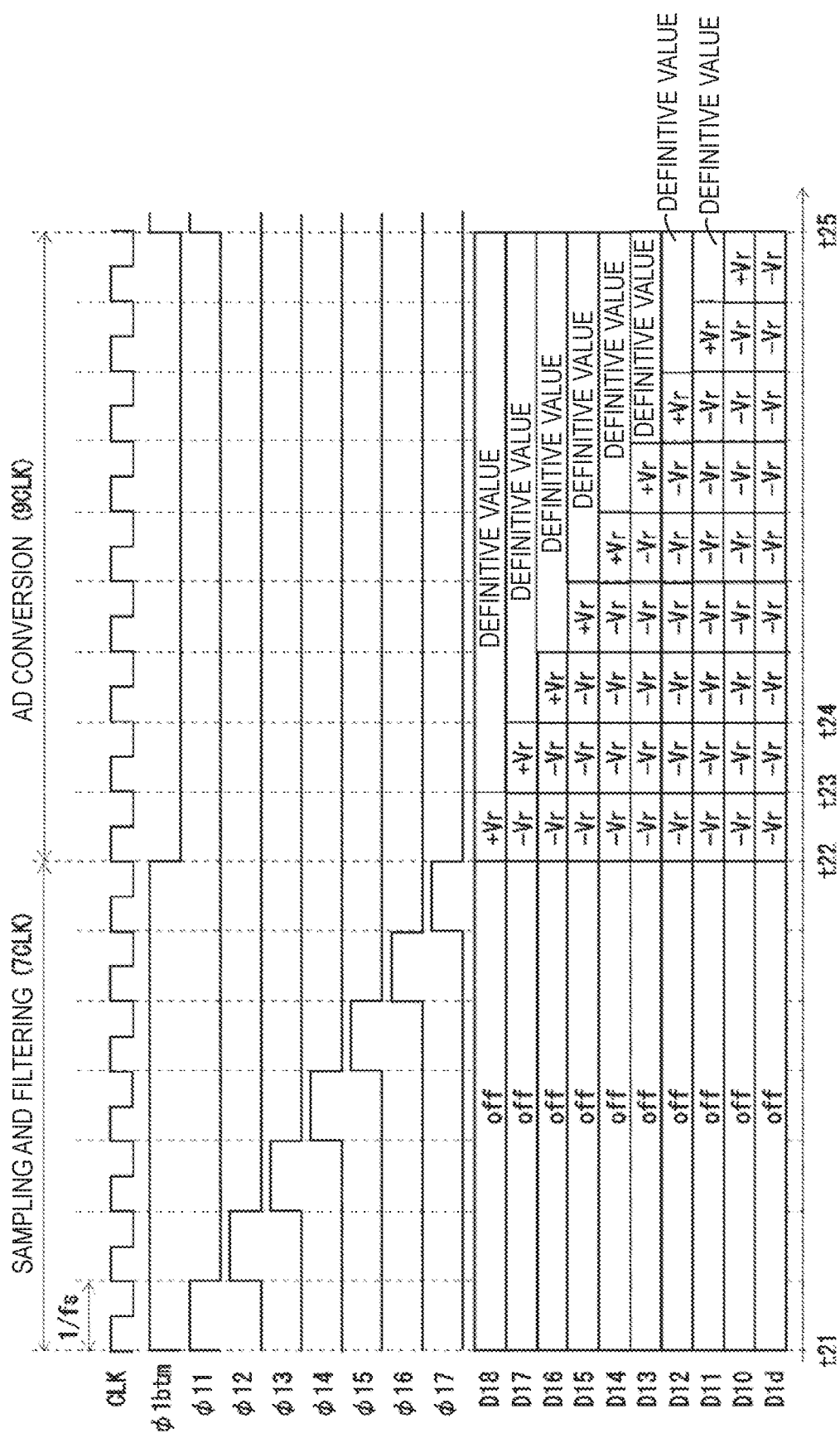
FIG. 20 is a timing chart illustrating an operation of the low speed AD converter shown in FIG. 19.

FIG. 20 is a timing chart illustrating an operation of the low speed AD converter LC2.

First, in a sampling mode, when the control signal φ1btm is set to H level and the switch SW1_b is turned on, a ground level voltage (0V) is supplied to the electrodes on one side of the capacitive elements C1_5, C1_6, C1_8c, C1_7, C1_8b, C1_8a, and C1_x (times t21 to t22). In addition, when the control signals D8 to D0 and Dd indicate that the supply of the voltages "+Vr" and "−Vr" to the capacitive element is stopped ("off" in FIG. 20), the control signals φ11 to φ17 are temporarily set to H level in order, whereby charges of the input voltage Vi are sequentially accumulated in the electrodes on the other side of the capacitive element electrodes C1_5, C1_6, C1_8c, C1_7, C1_8b, C1_8a, and C1_x (times t21 to t22). That is, in the sampling mode, not only the sampling of the input voltage Vi but also the filtering by the analog filter FLT2 is simultaneously performed.

Thereafter, in a hold mode, the control signal φ1btm changes from H level to L level, and the switch SW1_b is turned off. Therefore, the electrodes on one side of each capacitive element are switched to a floating state. The control signals φ11 to φ17 are all switched from H level to L level, whereby the supply of the input voltage Vi to the electrodes of the other side of each capacitive element is stopped (time t22).

Thereafter, in a charge-redistribution mode, first, the voltage "+Vr" is supplied to the electrodes on the other side of the capacitive element C1_8 of the most significant bit, and the voltage "−Vr" is supplied to the electrodes on the other side of the remaining capacitive elements C1_7 to C1_0 and C1_d (times t22 to t23). As a result, a voltage −Vi is supplied as a differential voltage to two input terminals of the comparator 202. Based on the comparison result of the comparator 202 at this time, the comparison control unit 203 fixes the voltage supplied to the electrode on the other side of the capacitive element C1_8 of the most significant bit to either the voltages "+V" or "−Vr" (times t23 to t25). For example, if Vi>0, a value of the most significant bit of the digital signal (the output signal S21) output from the comparison control unit 203 is determined to be 1. In this instance, a voltage supplied to the electrode on the other side of the capacitive element C1_8 of the most significant bit is fixed to the voltage "+Vr". If Vi<0, a value of the most significant bit of the digital signal output from the comparison control unit 203 is determined to be 0. Here, a voltage supplied to the electrode on the other side of the capacitive element C1_8 of the most significant bit is fixed to the voltage "−Vr".

Thereafter, the voltage "+Vr" is supplied to the electrode on the other side of the capacitive element C1_7, which is a upper bit following the most significant bit, and the voltage "−Vr" is supplied to the electrodes on the other side of the remaining capacitive elements C1_6 to C1_0 and C1_d (times t23 to t24). As a result, "−Vi+Vr·(the value of the most significant bit)−Vr/2" is supplied to the two input terminals of the comparator 202 as the differential voltage. Based on the comparison result of the comparator 202 at this time, the comparison control unit 203 determines a value of a second most significant bit of the digital signal, and fixes a voltage supplied to the electrode on the other side of the capacitive element C1_7 to either the voltages "+V" or "−Vr" (times t24 to t25).

Such an operation is sequentially repeated up to the capacitive element C1_0 of the least significant bit, whereby the digital signal (the output signal S21) output from the comparison control unit 203 is fixed (time t25).

In the embodiment, the AD converter LC2 is comprised with the four successive approximation AD converters arranged in parallel. The AD converter LC2 can execute AD conversion efficiently and with high accuracy by executing AD conversion at different timings using the four successive approximation AD converters. Hereinafter, in addition to FIG. 19 and FIG. 20, a brief description will be given with reference to FIG. 21.

Figure 21:
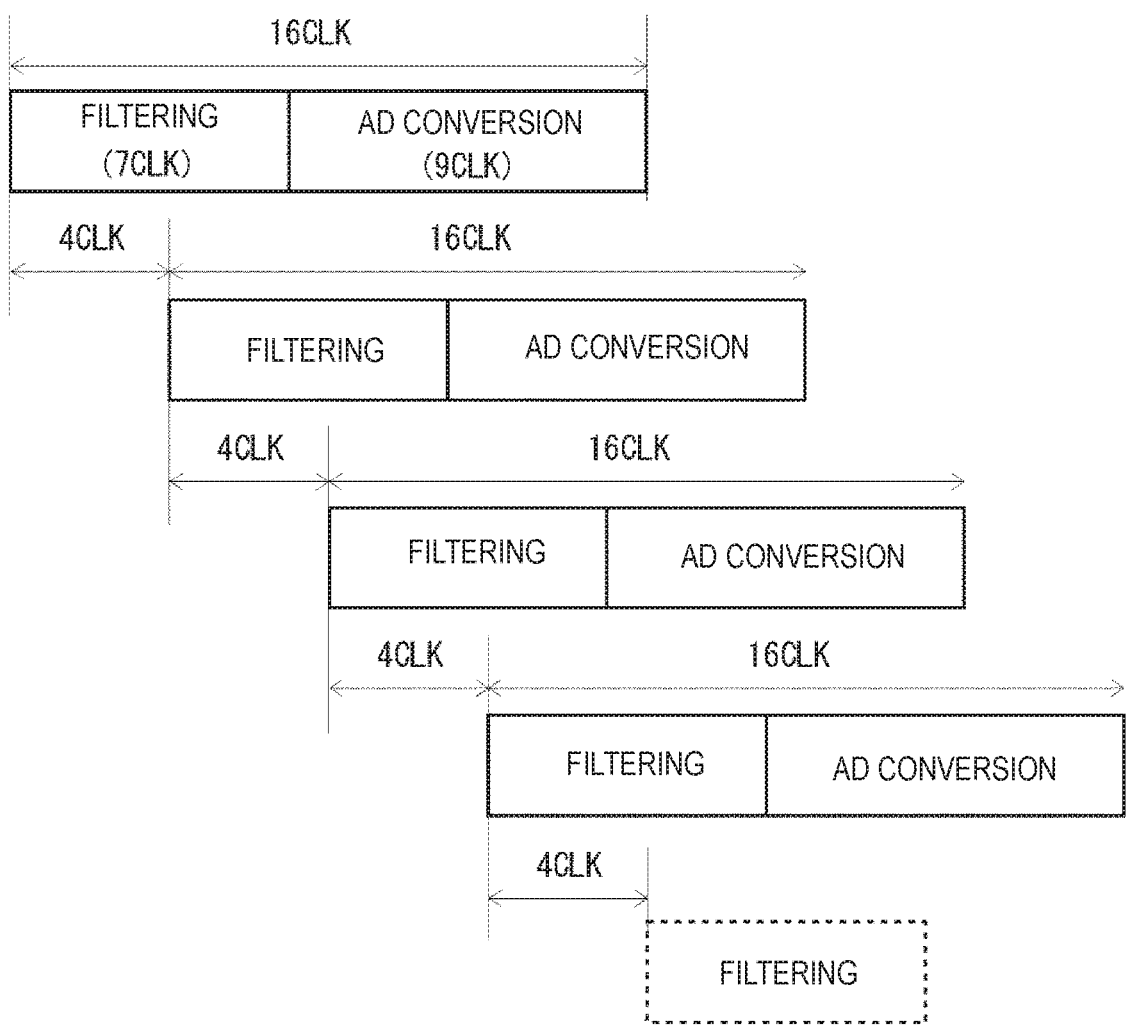
FIG. 21 is a diagram for explaining an operation of four successive approximation AD converters comprising the low speed AD converter shown in FIG. 19.

FIG. 21 is a diagram for explaining an operation of the four successive approximation AD converters comprising the AD converter LC2. In the embodiment, the AD converter LC2 performs sampling at the sampling frequency fs/M which is 1/M of the sampling frequency fs of the modulator SDM1 in the initial stage. That is, each of the four successive approximation AD converters comprising the AD converter LC2 performs sampling by shifting the times every M clock cycles. In this instance, an AD conversion period allocated to one successive approximation AD converter is a clock cycle of "M×the number of successive approximation AD converters (the number of slices)−the number of analog filter taps". In the embodiment, since M=4, the number of slices=4, and the number of taps=7, the AD conversion period allocated to one successive approximation AD converter is 9 (=4×4−7) clock cycles.

First, in a first successive approximation AD converter, the sampling and filtering are performed for a period of 7 clock cycles, and then the AD conversion is performed for a period of 9 clock cycles. In a second successive approximation AD converter, after the 4 clock cycles have elapsed from a start of the sampling by the first successive approximation AD converter, the sampling and the filtering are performed for a period of 7 clock cycles, and then the AD conversion is performed for a period of 9 clock cycles. In a third successive approximation AD converter, after 4 clock cycles have elapsed from a start of the sampling by the second successive approximation AD converter, the sampling and the filtering are performed for a period of 7 clock cycles, and then the AD conversion is performed for a period of 9 clock cycles. In a fourth successive approximation AD converter, after 4 clock cycles have elapsed from a start of the sampling by the third successive approximation AD converter, the sampling and the filtering are performed for a period of 7 clock cycles, and then the AD conversion is performed for a period of 9 clock cycles. Here, after 4 clock cycles have elapsed from a start of the sampling by the fourth successive approximation AD converter, the AD conversion by the first successive approximation AD converter is completed. Therefore, the subsequent sampling and filtering by the first successive approximation AD converter are started. such an operation is repeated.

As described above, the MASH type sigma delta AD converter device 2 according to the second embodiment is as effective as the MASH type sigma delta AD converter device 1. Further, in the MASH type sigma delta AD converter device 2 according to the second embodiment, since the analog filter FLT2 and the low speed AD converter LC2 share the capacitive element, it is possible to suppress an increase in the circuit scale, and it is unnecessary to provide a buffer between the analog filter FLT2 and the low speed AD converter LC2. Therefore, it is possible to suppress an increase in power consumption.

In the embodiment, M=4, the case where the number of slices=4, and the number of taps=7 are is described as example, but the present invention is not limited thereto. The value of M, the number of slices, and the number of taps can be set to any value as long as the AD conversion can be executed efficiently and with high accuracy. Each successive approximation AD converter is not limited to the case of generating a digital signal having 9-bit width, and each can be appropriately changed to the case of generating a digital signal having an arbitrary bit width determined according to the value of M, the number of slices, the number of taps, and the like.

Third Embodiment

Figure 22:
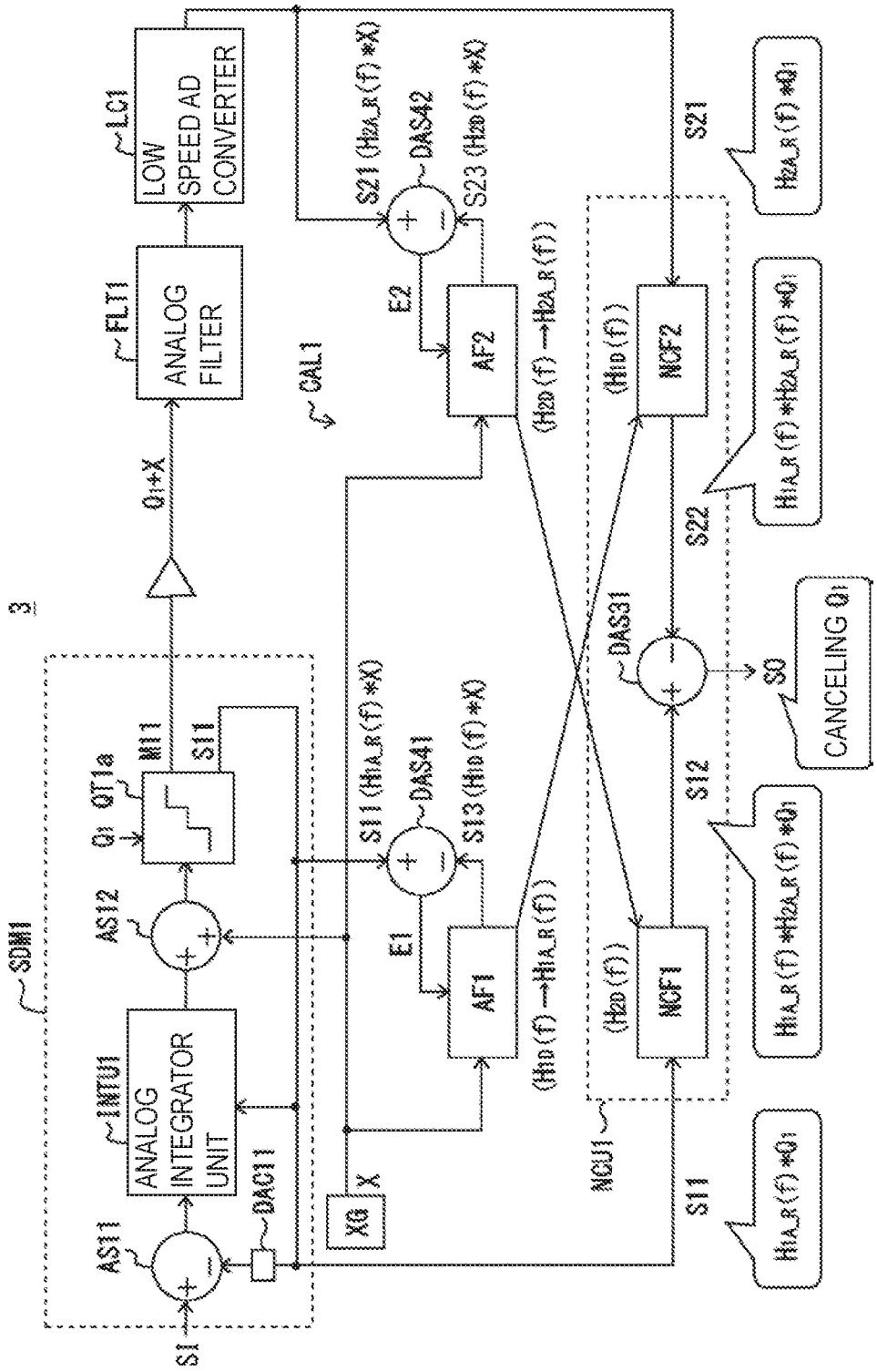
FIG. 22 is a block diagram illustrating a configuration example of a main part of a MASH type sigma delta AD converter device according to a third embodiment.

FIG. 22 is a block diagram illustrating a configuration example of a main part of a MASH type sigma delta AD converter device 3 according to a third embodiment.

As shown in FIG. 22, the MASH type sigma delta AD converter device 3 includes a successive approximation AD converter QT1a as the quantizer QT1 provided in the sigma delta modulator SDM 1, and outputs a voltage signal M11 of a charge-holding node N2 of the successive approximation AD converter QT1a to the analog filter FLT1 as the output signal of the sigma delta modulator SDM1, as compared with the MASH type sigma delta AD converter device 1. The MASH type sigma delta AD converter device 3 does not include the DA converter circuits DAC12 and DAC13, and the analog adder-subtractor AS21.

Details of Successive Approximation AD Converter

Figure 23:
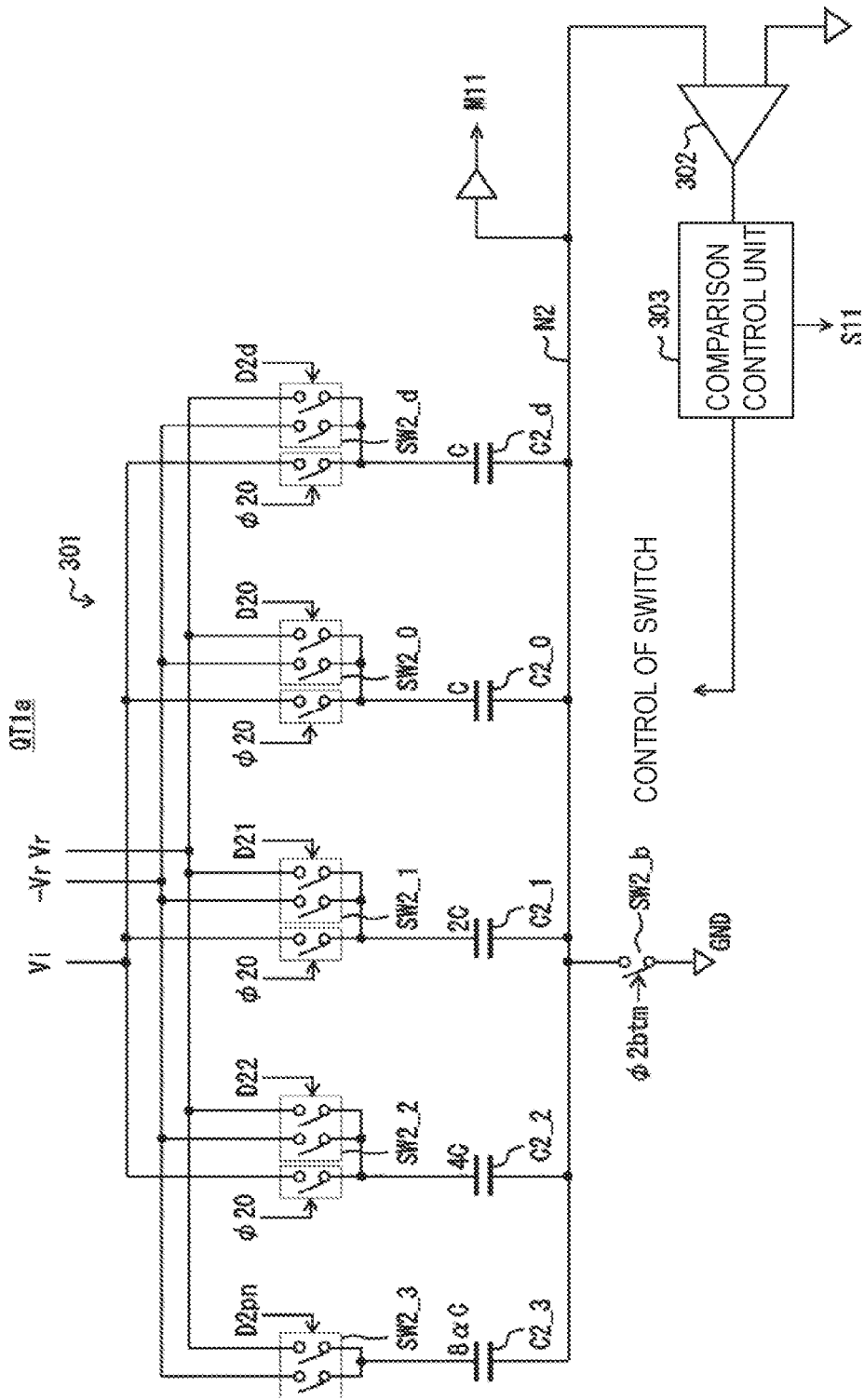
FIG. 23 is a diagram illustrating a specific configuration example of a quantizer provided in a sigma delta modulator of the MASH type sigma delta AD converter device shown in FIG. 22.

FIG. 23 is a diagram illustrating a configuration example of the successive approximation AD converter QT1a. In FIG. 23, the function of the analog adder-subtractor AS12 is incorporated in the successive approximation AD converter QT1a. In the embodiment, the successive approximation AD converter QT1a is a single-ended type, but the present invention is not limited to this, and may be of a differential amplifying type.

As shown in FIG. 23, the successive approximation AD converter QT1a includes a DA converter 301, a comparator 302, and a comparison control unit 303. The DA converter 301 converts a digital signal sequentially output from the comparison control unit 303 into an analog voltage V2a with the range from the lower limit value "−Vr" to the upper limit value "+Vr" as the full scale. The DA converter 301 also includes a function as a sample-hold circuit for sampling and holding an input voltage (referred to as Vi for convenience sake). The comparator 302 compares the input voltage Vi held by the sample-and-hold function of the DA converter 301 with the analog voltage V2a resulting from the AD conversion by the DA converter 301, and outputs a comparison result. The comparison control unit 303 switches a value of a digital signal based on the comparison result by the comparator 302. By repeating such an operation, the value of the digital signal corresponding to the analog voltage V2a indicating a value closest to the input voltage Vi is determined. The successive approximation AD converter QT1a outputs the digital signal as an output signal S11.

Specifically, the DA converter 301 includes three capacitive elements $C2\_2$ to $C2\_0$ with binary-weighted capacitive values from the upper bit to the lower bit, a capacitive element $C2\_d$ with the same capacitive value as the capacitive element $C2\_0$ of the least significant bit, a capacitive element $C2\_3$ with a capacitance value $8\alpha C$ obtained by multiplying a coefficient α to a capacitance value 8C, which is 2 times a capacitance value of the capacitive element $C2\_2$ of the most significant bit, and a plurality of switches $SW2\_3$ to $SW2\_0$ and $SW2\_d$ provided in series in each of capacitive elements $C2\_3$ to $C2\_0$ and $C2\_d$ respectively. The switch $SW2\_b$ is provided between a grounding terminal GND and a node between electrodes (electrodes on a side of a charge-holding node N2) on one side of the capacitive elements $C2\_3$ to $C2\_0$ and $C2\_d$ and the comparator 302.

The switches $SW2\_2$ to $SW2\_0$ and $SW2\_d$ are controlled by the comparison control unit 303, based on an operation mode and a value of digital signal to be DA-converted. For example, the switch $SW2\_2$ selects one of the voltages "+Vr", "−Vr" and Vi by a control signal D22 and a control signal φ20, and supplies the selected voltage to an electrode on the other hand of the capacitive element C2_2. The switch SW2_1 selects one of the voltages "+Vr", "−Vr" and Vi by a control signal D21 and the control signal φ20, and supplies the selected voltage to an electrode on the other side of the capacitive element C2_1. The switch SW2_0 selects one of the voltages "+Vr", "−Vr" and Vi by a control signal D20 and the control signal φ20, and supplies the selected voltage to an electrode on the other side of the capacitive element C2_0. The switch SW2_d selects one of the voltages "+Vr", "−Vr" and Vi by a control signals D2d and the control signal φ20, and supplies the selected voltage to an electrode on the other side of capacitive element C2_d. The switch SW 2_b is turned on and off by a control signal φ2btm.

The switch SW 2_3 is controlled by a control signal φD2pm indicating a value corresponding to the probe signal X. For example, the switch SW2_3 supplies the voltage "+Vr" to an electrode on the other side of the capacitive element C2_3 when the probe signal X indicates "+1". The switch SW2_3 supplies the voltage "−Vr" to the electrode on the other side of the capacitive element C2_3 when the probe signal X indicates "−1".

Figure 24:
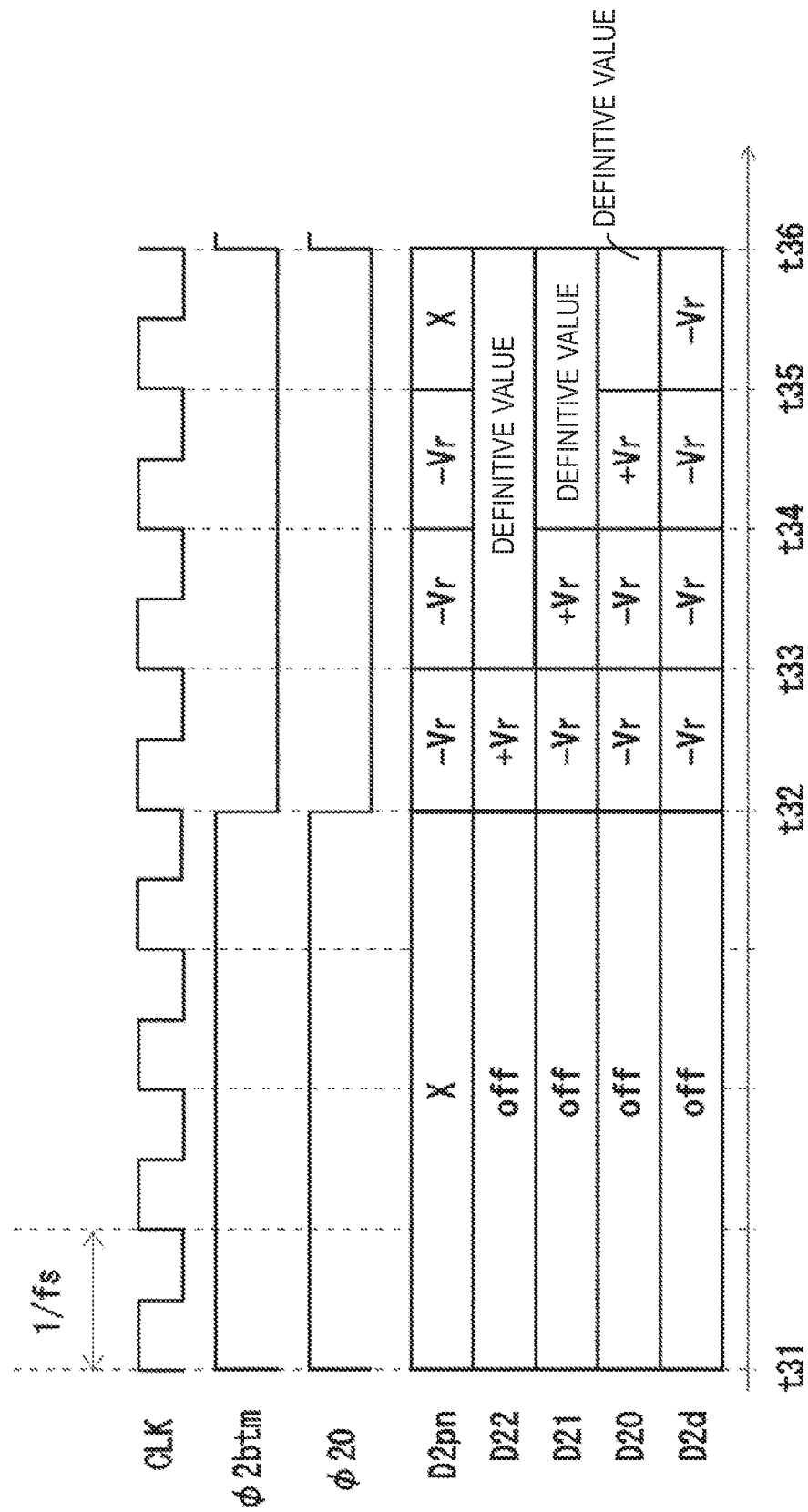
FIG. 24 is a timing chart illustrating an operation of a successive approximation AD converter, which is the quantizer shown in FIG. 23.

FIG. 24 is a timing chart illustrating an operation of the successive approximation AD converter QT1a.

First, in the sampling mode, when the control signal φ2btm is set to H level and the switch SW 2_b is turned on, a ground level voltage (0V) is supplied to one of the electrodes on the other side of the capacitive elements C2_3 to C2_0 and C2_d (times t31 to t32). In addition, when the control signals D22 to D20 and D2d indicate that the supply of the voltages "+Vr" and "−Vr" to the electrodes on the other side of the capacitive elements 2_2 to C2_0 and C2_d is stopped ("off" in FIG. 24), the control signal T20 sets to H level, whereby the input voltage Vi is supplied to the electrodes on the other side of the capacitive elements C2_2 to C2_0 and C2_d (times t31 to t32). At this time, either the voltage "+Vr" or "−Vr" according to the probe signal X is supplied to the electrode on the other side of the capacitive element C2_3 (times t31 to t32). That is, the component of the probe signal X is added to the input voltage Vi.

Thereafter, in the hold mode, the control signal γ2btm changes from H level to L level, and the switch SW2_b is turned off. Therefore, the electrodes on one side of the capacitive elements C2_3 to C2_0 and C2_d are switched to the floating state. The control signal φ20 is switched from H level to L level, whereby the supply of the input voltage Vi to the electrodes of the other side of each the capacitive element C2_2 to C2_0, C2_d is stopped (time t32).

Thereafter, in the charge-redistribution mode, first, the voltage "+Vr" is supplied to the electrode on the other side of the capacitive element C2_2 of the most significant bit, and the voltage "−Vr" is supplied to the electrode on the other side of the remaining capacitive elements C2_3, C2_1, C2_0 and C2_d (times t32 to t33). As a result, "−Vi−(the voltage of the component of the probe signal X)" is supplied as a differential voltage to two input terminals of the comparator 302. Based on the comparison result of the comparator 302 at this time, the comparison control unit 303 fixes the voltage supplied to the electrode on the other side of the capacitive element C2_2 of the most significant bit to either the voltages "+Vr" or "−Vr" (times t33 to t36). For example, if "Vi+(the voltage of the component of the probe signal X)">0, a value of the most significant bit of the digital signal (the output signal S11) output from the comparison control unit 303 is determined to be 1. Here, a voltage supplied to the electrode on the other side of the capacitive element C2_2 of the most significant bit is fixed to the voltage "+Vr". On the other hand, if "Vi+(the voltage of the component of the probe signal X)"<0, a value of the most significant bit of the digital signal output from the comparison control unit 303 is determined to be 0. Here, a voltage supplied to the electrode on the other side of the capacitive element C2_2 of the most significant bit is fixed to the voltage "−Vr".

Thereafter, the voltage "+Vr" is supplied to the electrode on the other side of the capacitive element C2_1, which is a upper bit following the most significant bit, and the voltage "−Vr" is supplied to the electrode on the other side of the remaining capacitive elements C2_3, C2_0 and C2_d (times t33 to t34). As a result, "−Vi+Vr·(the value of the most significant bit)−Vr/2" is supplied to the two input terminals of the comparator 302 as a differential voltage. Based on the comparison result of the comparator 302 at this time, the comparison control unit 303 determines a values of a second most significant bit of the digital signal, and fixes a voltage supplied to the electrode on the other side of the capacitive element C2_1 to either the voltages "+V" and "−Vr" (times t34 to t36).

Such an operation is sequentially repeated up to the capacitive element C2_0 of the least significant bit, whereby the digital signal (the output signal S11) output from the comparison control unit 203 is fixed (time t25). The output signal S11 includes the component of the probe signal X.

Then, either voltages "+Vr" or "−Vr" according to the probe signal X is again supplied to the electrode on the other side of the capacitive element C2_3 (times t35 to t36). As a result, the charge-holding node N2 has a voltage value obtained by adding the component of the probe signal X and the quantization error Q1. The voltage of the charge-holding nodes N2 is output to the analog filter FLT2 as an intermediate signal M11 of the successive approximation AD converter QT1a.

Since the rest of the configuration of the MASH type sigma delta AD converter device 3 is the same as that of the MASH type sigma delta AD converter device 1, its explanation is omitted.

As described above, the MASH type sigma delta AD converter device 3 according to the third embodiment is as effective as the MASH type sigma delta AD converter device 1. Further, since the MASH type sigma delta AD converter device 3 according to the third embodiment does not need to be provided with the analog adder-subtractor AS21, it is possible to suppress an increase in the size of the circuits and to suppress an increase in the power consumed.

In the embodiment, the case where the successive approximation AD converter QT1a generates the output signal S11 having 3-bit width is described as example, but the present invention is not limited to thereto, and the present invention can be appropriately changed to a configuration for generating the output signal S11 having any bit width.

Fourth Embodiment

Figure 25:
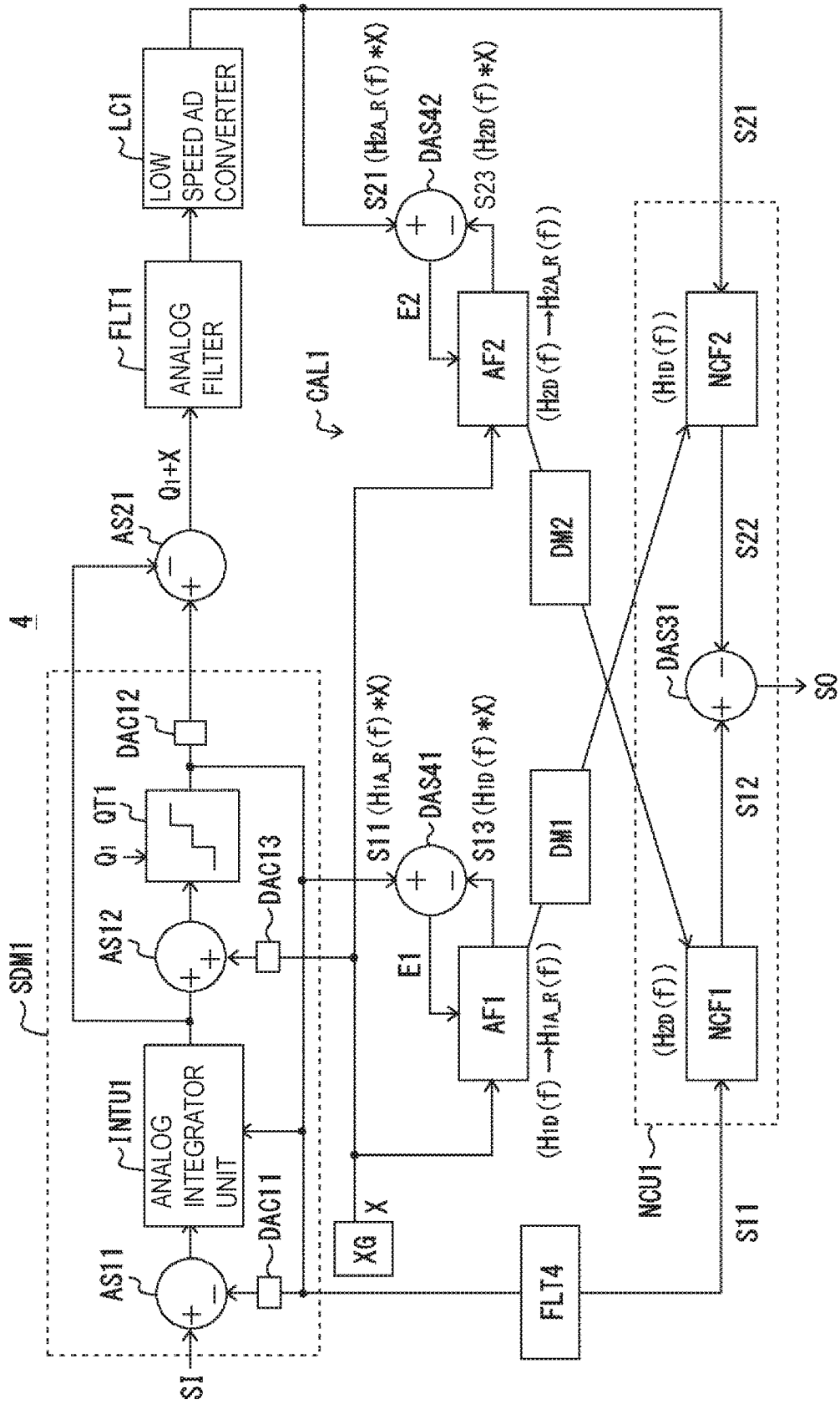
FIG. 25 is a block diagram illustrating a configuration example of a main part of a MASH type sigma delta AD converter device according to a fourth embodiment.

FIG. 25 is a block diagram illustrating a configuration example of a main part of a MASH type sigma delta AD converter device 4 according to a fourth embodiment.

As shown in FIG. 25, the MASH type sigma delta AD converter device 4 further includes a filter FLT4, a tap coefficient conversion & thinning circuit (hereinafter referred to as thinning circuit) DM1, and a thinning circuit DM2, as compared with the MASH type sigma delta AD converter device 1.

The filter FLT4 is provided between the sigma delta modulator SDM1 and the noise cancellation filter NCF1. The filter FLT4 filters the output signal S11 of the sigma delta modulator SDM1, and outputs the filtered output signal S11 to the noise cancellation filter NCF1.

Here, the transfer function $H_{1D}(f)$ of the noise cancellation filter NCF2 is preferably adjusted as represented by a product of the transfer function $H_{1A\_R}(f)$ searched for by the adaptive filter AF1 and a transfer function of the filter FLT4. Therefore, the thinning circuit DM1 first calculates the product of the transfer function $H_{1A\_R}(f)$ searched for by the adaptive filter AF1 and the transfer function of the filter FLT4.

The noise cancellation filter NCF2 usually operates at the same operation frequency fs/M as the low speed AD converter LC1. However, a transfer function calculated by the thinning circuit DM1 is calculated on the assumption that it operates at the operation frequency fs. Then, the thinning circuit DM1 further thins out a plurality of tap coefficients used to represent the calculated transfer function by 1/M. As a result, it is assumed that the tap coefficient output from the thinning circuit DM1 operates at the operation frequency fs/M. The transfer function $H_{1D}(f)$ of the noise cancellation filter NCF2 is adjusted by the tap coefficient output from the thinning circuit DM1.

On the other hand, the noise cancellation filter NCF1 normally operates at the operation frequency fs/M, in accordance with the noise cancellation filter NCF2. Therefore, the thinning circuit DM2 thins out a plurality of tap coefficient used to represent the transfer function $H_{2A\_R}(f)$ searched by the adaptive filter AF2 by 1/M. As a result, it is assumed that the tap coefficient output from the thinning circuit DM2 operates at the operation frequency fs/M. The transfer function $H_{2D}(f)$ of the noise cancellation filter NCF1 is adjusted by the tap coefficient output from the thinning circuit DM2.

Since the rest of the configuration of the MASH type sigma delta AD converter device 4 is the same as that of the MASH type sigma delta AD converter device 1, its explanation is omitted.

The MASH type sigma delta AD converter device 4 according to the fourth embodiment is as effective as the MASH type sigma delta AD converter device 1. Further, the MASH type sigma delta AD converter device 4 thins out the plurality of tap coefficients used to represent the transfer functions searched by each of the adaptive filters AF1 and AF2 by 1/M. Therefore, the MASH type sigma delta AD converter device 4 can adopt the thinning result as transfer functions suitable for each of the noise cancellation filters NCF 2 and NCF1 operating at the same operation frequency fs/M as the low speed AD converter LC1.

It should be noted that the configuration of the MASH type sigma delta AD converter 4 can be adopted not only for the MASH type sigma delta AD converter device 1 but also for other MASH type sigma delta AD converter devices.

Fifth Embodiment

Figure 26:
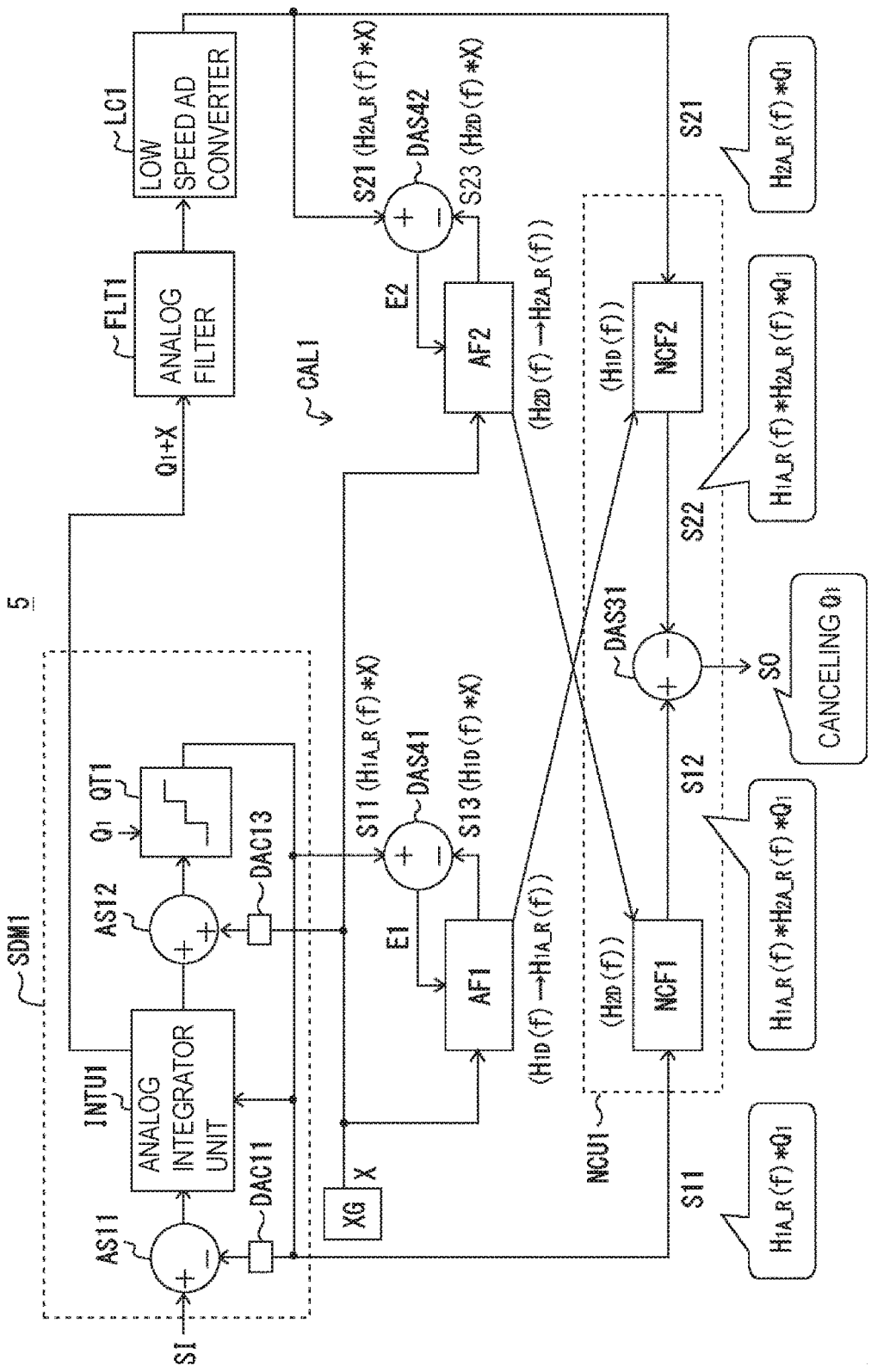
FIG. 26 is a block diagram illustrating a configuration example of a MASH type sigma delta AD converter device according to a fifth embodiment.

FIG. 26 is a block diagram illustrating a configuration example of a main part of a MASH type sigma delta AD converter device 5 according to a fifth embodiment.

As shown in FIG. 26, as compared with the MASH type sigma delta AD converter device 1, the MASH type sigma delta AD converter device 5 generates an addition signal, which is obtained by adding the component of the probe signal X and the quantization error Q1, by combining voltages of a plurality of inner nodes of the analog integrator unit INTU1, rather than generating an addition signal, which is obtained by adding the component of the probe signal X and the quantization error Q1, by subtracting the signals before and after the quantizer QT1 by the analog adder-subtractor AS21.

The rest of the configuration of the MASH type sigma delta AD converter device 5 is the same as that of the MASH type sigma delta AD converter device 1, and therefore its explanation is omitted.

The MASH type sigma delta AD converter device 5 according to the fifth embodiment is as effective as the MASH type sigma delta AD converter device 1. Further, since the MASH type sigma delta AD converter device 5 does not need to be provided with the analog adder-subtractor AS21 and the DA converter circuit DAC12, it is possible to suppress an increase in the size of the circuits and to suppress an increase in the power consumed.

The configuration of the MASH type sigma delta AD converter device 5 can be adopted not only for the MASH type sigma delta AD converter device 1 but also for other MASH type sigma delta AD converter devices.

As described above, the MASH type sigma delta AD converter devices according to the first, second, third, fourth and fifth embodiments can cancel the quantization error Q1 generated in the quantizer QT1 by using the calibration circuit CAL1, whereby the highly accurate AD conversion can be executed. Furthermore, the MASH type sigma delta AD converter devices according to the first, second, third, fourth and fifth embodiments comprise the analog filter and the low speed AD converter instead of further comprising the sigma delta modulator in the latter stage of the sigma delta modulator in the initial stage. As a result, the MASH type sigma delta AD converter devices according to the first, second, third, fourth and fifth embodiments can reduce the analog integrator unit, the quantizer, and the DA converter circuit required for high-speed operation, thereby reducing the power consumed.

Further, the MASH type sigma delta AD converter devices according to the first, second, third, fourth and fifth embodiments are not limited to the characteristic variation of the analog integrator, and the quantization error Q1 can be cancelled by using the noise cancellation filters NCF1 and NCF2 even in a situation in which the characteristic variations of various other circuits (for example, a characteristic variation of the analog adder-subtractor, a characteristic variation due to a reference voltage mismatch between the quantizer and the DA converter circuit, and the like) exists.

Further, the MASH type sigma delta AD converter devices according to the first, second, third, fourth and fifth embodiments can perform the searching operation of the adaptive filters AF1 and AF2 in the background while performing the A/D converter for the external input signal SI. Thereby, even when the characteristics of the various circuits are changed due to, for example, a variation in the use environment, the quantization error Q1 can be quickly cancelled by using the noise cancellation filters NCF1 and NCF2.

Although the invention made by the inventors has been specifically described based on the embodiment, the present invention is not limited to the embodiment already described, and it is needless to say that various modifications can be made without departing from the gist thereof.

For example, in the semiconductor device according to the above embodiments, a conductivity type (p-type or n-type) of a semiconductor substrate, a semiconducting layer, a diffusion layer (diffusion area), and the like may be inverted. Therefore, in the case where one of the conductivity types of the n-type and the p-type is the first conductivity type and the other conductivity type is the second conductivity type, the first conductivity type can be the p-type and the second conductivity type can be the n-type, or on the contrary, the first conductivity type can be the n-type and the second conductivity type can be the p-type.

What is claimed is:

1. A MASH (Multi stAge Noise SHaping) type sigma delta AD converter device comprising:
    a probe signal generation circuit for generating a probe signal;
    a first modulator including a first analog integrator configured with an analog circuit and a first quantizer for quantizing an addition signal obtained by adding the probe signal and an output signal of the first analog integrator;
    an analog filter for filtering an extraction signal obtained by extracting the probe signal and a quantization error generated in the first quantizer;
    a first AD converter for converting an output signal of the analog filter from an analog signal to a digital signal, the first AD converter operating at an operation frequency lower than an operation frequency of the first modulator;
    a first adaptive filter for searching for a first transfer function which is a transfer function of the first modulator by observing an output signal of the first quantizer in accordance with the probe signal;
    a second adaptive filter for searching for a second transfer function which is a transfer function from an output of the first modulator to the first AD converter via the analog filter by observing an output signal of the first AD converter in accordance with the probe signal; and
    a noise cancellation circuit for canceling the quantization error and the probe signal included in the output signal of the first quantizer using the search result of the first adaptive filter and the search result of the second adaptive filter.

2. The MASH type sigma delta AD converter device according to claim 1,
    wherein the analog filter is a low pass filter.

3. The MASH type sigma delta AD converter device according to claim 1,
    wherein the analog filter is an operational amplifier feedback type active filter.

4. The MASH type sigma delta AD converter device according to claim 1,
    wherein the analog filter is a Gm-C filter.

5. The MASH type sigma delta AD converter device according to claim 1,
    wherein the analog filter is a discrete time type filter.

6. The MASH type sigma delta AD converter device according to claim 1,
    wherein the analog filter includes a plurality of discrete time type filters arranged in parallel, and
    wherein the plurality of discrete time type filters are configured to filter at different timings.

7. The MASH type sigma delta AD converter device according to claim 1,
    wherein the analog filter is configured to be able to adjust a frequency characteristic in accordance with the search result of the second adaptive filter.

8. The MASH type sigma delta AD converter device according to claim 7,
    wherein the analog filter includes a capacitive element configured to be able to adjust a capacitance value for determining the frequency characteristic in accordance with the search results of the second adaptive filter.

9. The MASH type sigma delta AD converter device according to claim 1,
    wherein the first AD converter is a nyquist AD converter.

10. The MASH type sigma delta AD converter device according to claim 1,
    wherein the first AD converter is a successive approximation AD converter, and
    wherein the analog filter is configured using a capacitive element formed in the first AD converter.

11. The MASH type sigma delta AD converter device according to claim 1,
    wherein the first AD converter includes a plurality of successive approximation AD converters arranged in parallel,
    wherein the analog filter includes a plurality of discrete time type filters arranged in parallel,
    wherein the plurality of discrete time type filters are configured to filter at different timings and configured using capacitive elements formed in the plurality of successive approximation AD converters, respectively, and
    wherein the plurality of successive approximation AD converters are configured to convert output signals of the plurality of discrete time type filters from analog signals to digital signals, respectively.

12. The MASH type sigma delta AD converter device according to claim 1,
    wherein the first quantizer is a successive approximation type AD converter and is configured to output a voltage of a node, at which a voltage corresponding to the probe signal is held in the first quantizer, as the extraction signal.

13. The MASH type sigma delta AD converter device according to claim 1,
    wherein the first quantifier is a successive approximation AD converter, and
    wherein the first quantifier comprises:
        a sample-hold circuit for sampling and holding the output signal of the first analog integrator;
        a DA converter configured using the sample-hold circuit and for converting a digital signal successively output from a comparison control unit to an analog signal;
        a comparator for comparing a voltage of an output signal of the first analog integrator held by the sample-hold circuit with a voltage of the analog signal converted by the DA converter; and
        the comparison control unit for switching a value of the digital signal based on the comparison result by the comparator,
    wherein the sample-hold circuit includes a plurality of first capacitive elements arranged in parallel and a second capacitive element arranged in parallel to the plurality of first capacitive elements,
    wherein the second capacitive element samples and holds a voltage corresponding to the probe signal, and
    wherein the voltage corresponding to the probe signal, which is held in the sample-hold circuit, is output as the extraction signal.

14. The MASH type sigma delta AD converter device according to claim 1, further comprising:
    a first thinning circuit for thinning out a plurality of tap coefficients used to represent the first transfer function searched for by the first adaptive filter in accordance with the operation frequency of the first AD converter; and a second thinning circuit for thinning out a plurality of tap coefficients used to represent the second transfer function searched for by the second adaptive filter in accordance with the operation frequency of the first AD converter, wherein the noise cancellation circuit cancels the quantization error and the probe signal included in the output signal of the first quantizer using an output of the first thinning circuit and an output of the second thinning circuit.

15. The MASH type sigma delta AD converter device according to claim 14, further comprising:

a digital filter for filtering the output signal of the first quantizer, wherein the first thinning circuit is further configured to multiply the first transfer function by a transfer function of the digital filter, and wherein the first thinning circuit is configured to thins out a plurality of tap coefficients used to represent a transfer function calculated by multiplying the first transfer function by the transfer function of the digital filter, in accordance with the operation frequency of the first AD converter.

16. The MASH type sigma delta AD converter device according to claim 1, wherein the probe signal is a 1-bit pseudo random signal.

17. The MASH type sigma delta AD converter device according to claim 1, wherein the noise cancellation circuit includes a first noise cancellation filter in which the first transfer function searched for by the first adaptive filter is set as transfer function, a second noise cancellation filter in which the second transfer function searched for by the second adaptive filter is set as transfer function, and a digital adder-subtractor for outputting a differential signal between an output signal of the first noise cancellation filter and an output signal of the second noise cancellation filter as an output signal of the noise cancellation circuit.

18. The MASH type sigma delta AD converter device according to claim 1, wherein the first adaptive filter is configured to search for a tap coefficient used to represent the first transfer function based on a first error signal representing an error between an output signal of the first adaptive filter and the output signal of the first quantizer in accordance with the probe signal, by using an LMS (Least Mean Square) algorithm, and wherein the second adaptive filter is configured to search for a tap coefficient used to represent the second transfer function based on a second error signal representing an error between an output signal of the second adaptive filter and the output signal of the first AD converter in accordance with the probe signal, by using the LMS algorithm.

19. A millimeter wave radar system comprising a plurality of the MASH type sigma delta AD converter devices according to claim 1, the millimeter wave radar system comprising:

a transmission antenna for radiating a transmission wave into the air;

a plurality of reception antennas for receiving a reflected wave from an object for the transmission wave;

a high frequency unit for generating a plurality of beat signals by down-converting the reflected wave received by the plurality of reception antennas using the transmission wave;

a low pass filter for filtering the plurality of beat signals; and a baseband unit for processing the plurality of beat signals filtered by the low pass filter, wherein the baseband unit includes a plurality of the MASH type sigma delta AD converters for converting the plurality of beat signals filtered by the low pass filter from analog signals to digital signals respectively.

20. A millimeter wave radar system comprising:

a transmission antenna for radiating a transmission wave into the air;

a plurality of reception antennas for receiving a reflected wave from an object for the transmission wave;

a high frequency unit for generate a plurality of beat signals by down-converting the reflected wave received by the plurality of reception antennas using the transmission wave;

a low pass filter for filtering the plurality of beat signals; and a baseband unit for processing the plurality of beat signals filtered by the low pass filter, wherein the baseband unit includes a plurality of MASH type sigma delta AD converters for converting the plurality of beat signals filtered by the low pass filter from analog signals to digital signals respectively;

wherein each of the MASH type sigma delta AD converters comprises:

a probe signal generation circuit for generating a probe signal;

a first modulator including a first analog integrator configured with an analog circuit and a first quantizer for quantizing an addition signal obtained by adding the probe signal and an output signal of the first analog integrator;

an analog filter for filtering an extraction signal obtained by extracting a quantization error generated in the first quantizer and the probe signal;

a first AD converter for converting an output signal of the analog filter from an analog signal to a digital signal, the first AD converter operating at an operation frequency lower than an operation frequency of the first modulator;

a first adaptive filter for searching for a first transfer function which is a transfer function of the first modulator by observing an output signal of the first quantizer in accordance with the probe signal;

a second adaptive filter for searching for a second transfer function which is a transfer function from an output of the first modulator to the first AD converter via the analog filter by observing an output signal of the first AD converter in accordance with the probe signal; and a noise cancellation circuit for canceling the quantization error and the probe signal included in the output signal of the first quantizer using the search result of the first adaptive filter and the search result of the second adaptive filter.

* * * * *